(12) United States Patent
Zhou

(10) Patent No.: US 12,527,180 B2
(45) Date of Patent: Jan. 13, 2026

(54) DISPLAY SUBSTRATE, DRIVING METHOD AND PREPARATION METHOD THEREOF, AND DISPLAY APPARATUS

(71) Applicants: Beijing BOE Technology Development Co., Ltd., Beijing (CN); BOE Technology Group Co., Ltd., Beijing (CN)

(72) Inventor: Jian Zhou, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 508 days.

(21) Appl. No.: 18/022,273

(22) PCT Filed: Mar. 24, 2022

(86) PCT No.: PCT/CN2022/082734
§ 371 (c)(1),
(2) Date: Feb. 21, 2023

(87) PCT Pub. No.: WO2023/178597
PCT Pub. Date: Sep. 28, 2023

(65) Prior Publication Data
US 2024/0284728 A1 Aug. 22, 2024

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/353* (2023.02);
(Continued)

(58) Field of Classification Search
CPC ............. H10K 59/353; H10K 59/1201; H10K 59/80515; H10K 59/80521; H10K 59/878; H10K 59/80518; H10K 59/8792
(Continued)

(56) References Cited

U.S. PATENT DOCUMENTS 12,222,615 B2 * 2/2025 Fang ................. G06F 3/011
2010/0171393 A1 7/2010 Pei et al.
(Continued)

FOREIGN PATENT DOCUMENTS

CN 107429164 A 12/2017
CN 108169893 A 6/2018
(Continued)

*Primary Examiner* — Christopher M Raabe
(74) *Attorney, Agent, or Firm* — Ling Wu; Stephen Yang; Ling and Yang Intellectual Property

(57) ABSTRACT

A display substrate includes a base substrate, and a first conductive layer, a deformation layer, a second conductive layer, and a nanoparticle layer stacked on the base substrate; the first conductive layer includes multiple first electrodes, the second conductive layer includes multiple second electrodes, and the nanoparticle layer includes multiple nanoparticles; the display substrate includes multiple sub-pixels defined by intersection of the multiple first electrodes and the multiple second electrodes; multiple first overlapping regions exist between orthographic projections of the multiple first electrodes and the multiple second electrodes on the base substrate, and a second overlapping region exists between any one of the first overlapping regions and an orthographic projection of at least one of the nanoparticles on the base substrate; and an orthographic projection of each sub-pixel on the base substrate at least partially overlaps with at least two adjacent second overlapping regions.

20 Claims, 15 Drawing Sheets

(51) Int. Cl.
*H10K 59/35* (2023.01)
*H10K 59/80* (2023.01)
H10K 102/00 (2023.01)

(52) U.S. Cl.
CPC . *H10K 59/80515* (2023.02); *H10K 59/80518* (2023.02); *H10K 59/80521* (2023.02); *H10K 59/878* (2023.02); *H10K 59/8792* (2023.02); H10K 2102/331 (2023.02)

(58) Field of Classification Search
USPC .................................................. 313/498–512
See application file for complete search history.

(56) References Cited

U.S. PATENT DOCUMENTS

| | | | |
|---|---|---|---|
| 2012/0139958 A1 | 6/2012 | Tang et al. | |
| 2017/0336663 A1 | 11/2017 | Hakemi et al. | |
| 2018/0201830 A1 | 7/2018 | Higuchi et al. | |
| 2019/0243124 A1 | 8/2019 | Liu et al. | |
| 2022/0210577 A1* | 6/2022 | Ha | H10N 30/883 |
| 2024/0196135 A1* | 6/2024 | Ha | H10N 30/852 |
| 2025/0208714 A1* | 6/2025 | Sung | B06B 3/00 |

FOREIGN PATENT DOCUMENTS

| | | |
|---|---|---|
| CN | 109950340 A | 6/2019 |
| CN | 210605251 U | 5/2020 |
| JP | 2006-218608 A | 8/2006 |
| TW | I603139 B | 10/2017 |
| WO | 2021178491 A1 | 9/2021 |

\* cited by examiner

DISPLAY SUBSTRATE, DRIVING METHOD AND PREPARATION METHOD THEREOF, AND DISPLAY APPARATUS

CROSS-REFERENCE TO RELATED APPLICATION

The present application is a U.S. National Phase Entry of International Application PCT/CN2022/082734 having an international filing date of Mar. 24, 2022, entitled "Display Substrate, Driving Method and Preparation Method Thereof, and Display Apparatus", and the entire contents of the above-identified application are hereby incorporated by reference.

TECHNICAL FIELD

Embodiments of the present disclosure relate to, but are not limited to, the field of display technology, and particularly to a display substrate, a method for driving the display substrate, a method for preparing the display substrate, and a display apparatus.

BACKGROUND

In recent years, display panels have been widely applied in mobile phones, computers, televisions (TVs), medical monitoring apparatuses, vehicle-mounted central control apparatuses, and other products with display functions. With a development of display technology, requirements for characteristics of display panels such as a volume, lightness and thinness, and the like are getting higher and higher.

SUMMARY

The following is a summary of subject matter described herein in detail. The summary is not intended to limit the protection scope of claims.

An embodiment of the present disclosure provides a display substrate, including a base substrate, and a first conductive layer, a deformation layer, a second conductive layer, and a nanoparticle layer stacked on the base substrate; the first conductive layer includes multiple first electrodes, the second conductive layer includes multiple second electrodes, and the nanoparticle layer includes multiple nanoparticles; the display substrate includes multiple sub-pixels defined by intersection of the multiple first electrodes and the multiple second electrodes; multiple first overlapping regions exist between an orthographic projection of the multiple first electrodes and the multiple second electrodes on the base substrate, and a second overlapping region exists between any one of the first overlapping regions and an orthographic projection of at least one of the nanoparticles on the base substrate; and an orthographic projection of each sub-pixel on the base substrate at least partially overlaps with at least two adjacent second overlapping regions.

In an exemplary implementation, the orthographic projection of each sub-pixel on the base substrate at least partially overlaps with two adjacent second overlapping regions; or, the orthographic projection of each sub-pixel on the base substrate at least partially overlaps with three adjacent second overlapping regions.

In an exemplary implementation, the display substrate includes multiple pixel units, wherein each pixel unit includes the multiple sub-pixels, and in a same pixel unit, an arrangement direction of the multiple sub-pixels is different from an arrangement direction of the at least two adjacent second overlapping regions in each sub-pixel.

In an exemplary implementation, the display substrate further includes a black matrix layer disposed between the second conductive layer and the nanoparticle layer, or disposed at a side of the nanoparticle layer away from the second conductive layer; and the black matrix layer includes multiple black matrix structures disposed between two adjacent sub-pixels.

In an exemplary implementation, in a plane where the display substrate is located, each first electrode has a strip-shaped structure extending along a direction at a first included angle with respect to a first direction, and the second electrode has a strip-shaped structure extending along a direction at a second included angle with respect to the first direction, wherein values of the first included angle and the second included angle range from 0° to 180°.

In an exemplary implementation, in the plane where the display substrate is located, the first electrodes extend along a second direction, the second electrodes extend along the first direction, wherein the first direction is perpendicular to the second direction.

In an exemplary implementation, the first electrodes and the second electrodes both have arc shapes, a bending direction of an arc shape of a first electrode is opposite to a bending direction of an arc shape of a second electrode, and the multiple sub-pixels are arranged along the arc shape.

In an exemplary implementation, the first electrodes are formed on the base substrate by electron beam evaporation.

In an exemplary implementation, the first electrodes and the second electrodes both have a light-transmitting structure.

In an exemplary implementation, the first electrodes have a light-reflecting structure, and the second electrodes have a light-transmitting structure.

In an exemplary implementation, the display substrate further includes a reflective layer, disposed at a side of the base substrate away from the first conductive layer.

In an exemplary implementation, the display substrate further includes a reflective layer and an insulating layer, wherein the reflective layer is disposed between the base substrate and the insulating layer, and the insulating layer is disposed between the reflective layer and the first conductive layer.

In an exemplary implementation, the nanoparticles are silver nanoparticles.

In an exemplary implementation, the nanoparticles have a thickness of 30 nm to 80 nm, and the nanoparticles have a width of 45 nm to 65 nm.

In an exemplary implementation, a material quality of the deformation layer is polyacrylate or silicone rubbers.

In an exemplary implementation, the nanoparticles are arranged periodically, and a distance between center positions of two adjacent nanoparticles is 200 nm to 400 nm.

In an exemplary implementation, a distance between a side of the nanoparticles facing the second conductive layer and one side of the first conductive layer facing the deformation layer is 2 nm to 20 nm.

An embodiment of the present disclosure further provides a display apparatus, which includes the display substrate described in any one of the above embodiments.

An embodiment of the present disclosure further provides a method for driving display, which drives the display substrate described in any one of the embodiments, including: applying different voltages to multiple first electrodes and multiple second electrodes to cause a deformation layer between the first electrodes and the second electrodes to generate different degrees of deformation.

An embodiment of the present disclosure further provides a method for preparing display, including: forming a first conductive layer at a side of a base substrate, the first conductive layer including multiple first electrodes arranged in parallel; forming a deformation layer at a side of the first conductive layer away from the base substrate; forming a second conductive layer at a side of the deformation layer away from the first conductive layer, the second conductive layer including multiple second electrodes arranged in parallel; and forming a nanoparticle layer at a side of the second conductive layer away from the deformation layer, the nanoparticle layer including multiple nanoparticles; wherein the display substrate includes multiple sub-pixels defined by intersection of the first electrodes and the second electrodes; multiple first overlapping regions exist between an orthographic projection of the multiple first electrodes on the base substrate and an orthographic projection of the multiple second electrodes on the base substrate, a second overlapping region exists between any one of the first overlapping regions and an orthographic projection of at least one of the nanoparticles on the base substrate; and an orthographic projection of each sub-pixel on the base substrate at least partially overlaps with at least two adjacent second overlapping regions.

In an exemplary implementation, the first electrodes are formed on the base substrate using an electron beam evaporation process.

In an exemplary implementation, the deformation layer is formed at the side of the first conductive layer away from the base substrate using a nano self-assembly process.

In an exemplary implementation, the nanoparticle layer is formed at the side of the second conductive layer away from the deformation layer using a point spin coating process.

Other aspects may be understood upon reading and understanding the drawings and detailed description.

BRIEF DESCRIPTION OF DRAWINGS

Accompanying drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of each component in the drawings do not reflect actual scales, and are only intended to schematically illustrate contents of the present disclosure.

FIG. 5b shows a schematic diagram of a cross-sectional structure at position A1-A1 in FIG. 5a.

DETAILED DESCRIPTION

Figure 1:
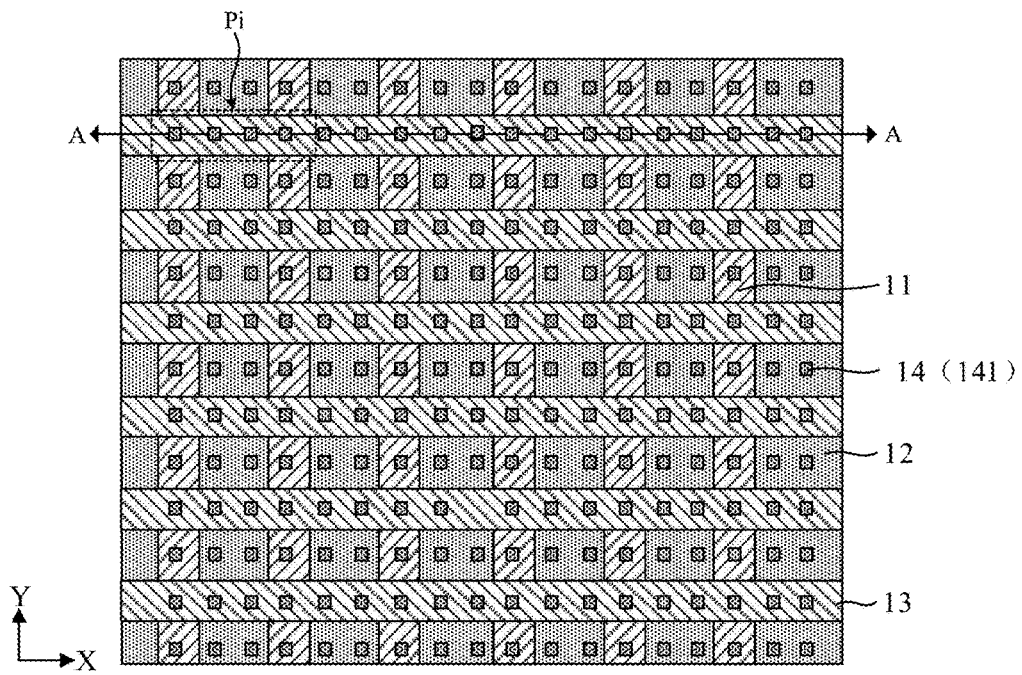
FIG. 1 shows a schematic diagram of a planar structure of a display substrate according to an embodiment of the present disclosure.

The embodiments of the present disclosure will be described in detail below with reference to the drawings. Implementations may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

Scales of the drawings in the present disclosure may be used as a reference in an actual process, but are not limited thereto. For example, a thickness and a pitch of each film layer, and a width and a pitch of each signal line may be adjusted according to an actual situation. The drawings described in the present disclosure are only schematic diagrams of structures, and one implementation of the present disclosure is not limited to shapes or numerical values or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to a direction which is used for describing each constituent element. Therefore, appropriate replacements may be made according to situations without being limited to the wordings described in the specification.

In the specification, unless otherwise specified and defined explicitly, terms "mount", "mutually connect", and "connect" should be understood in a broad sense. It may be a mechanical connection or an electrical connection. It may be a direct mutual connection, or an indirect connection through middleware, or internal communication between two components. Those of ordinary skills in the art may understand specific meanings of these terms in the present disclosure according to specific situations.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element having the certain electrical electrical effect" not only include electrodes and wirings, but also switching elements such as transistors, resistors, inductors, capacitors, other elements having one or more functions, and the like.

In the specification, "parallel" refers to a state in which an angle formed by two straight lines is above −10° and below 10°, and thus may include a state in which the angle is above −5° and below 5°. In addition, "perpendicular" refers to a state in which an angle formed by two straight lines is above 80° and below 100°, and thus may include a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulating layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc.

In the present disclosure, "about" refers to that a boundary is defined not so strictly and numerical values within process and measurement error ranges are allowed.

In the present disclosure, a "thickness" is a dimension of a film layer in a direction perpendicular to a substrate.

A thinness degree of a display panel is an important index for measuring characteristics of the display panel. At present, mainstream products in the display field include an Organic Light Emitting Diode (OLED) display device and a Liquid Crystal Display (LCD). Signal controlling needs to be performed by a Thin Film Transistor (TFT) for both the OLED display device and the LCD. The thin film transistor array may be disposed on a base substrate, which is simply called a TFT array substrate. Since the TFT array substrate involves preparation of multiple film layers, a preparation process is relatively complicated, and multiple film layers have a certain thickness, which leads to larger thicknesses of the OLED display device and the LCD, so an ultra-thin degree of the display panel is not high.

An embodiment of the present disclosure provides a display substrate, which may include a base substrate, and a first conductive layer, a deformation layer, a second conductive layer, and a nanoparticle layer stacked on the base substrate. The first conductive layer may include multiple first electrodes, the second conductive layer may include multiple second electrodes, and the nanoparticle layer may include multiple nanoparticles. The display substrate includes multiple sub-pixels cross-defined by the multiple first electrodes and the multiple second electrodes. There are multiple first overlapping regions between an orthographic projection of the multiple first electrodes on the base substrate and an orthographic projection of the multiple second electrodes on the base substrate, and there is a second overlapping region exists between any one of the first overlapping regions and an orthographic projection of at least one of the nanoparticles on the base substrate. An orthographic projection of each sub-pixel on the base substrate at least partially overlaps with at least two adjacent second overlapping regions.

A display substrate according to an embodiment of the present disclosure includes a first conductive layer, a deformation layer, a second conductive layer, and a nanoparticle layer stacked on a base substrate. The first conductive layer includes multiple first electrodes, the second conductive layer includes multiple second electrodes, there are multiple first overlapping regions between an orthographic projection of the multiple first electrodes on the base substrate and an orthographic projection of the multiple second electrodes on the base substrate, and there is a second overlapping region between any one of the first overlapping regions and an orthographic projection of at least one nanoparticle on the base substrate. An orthographic projection of each sub-pixel on the display substrate on the base substrate at least partially overlaps with at least two adjacent second overlapping regions. The display substrate according to the embodiment of the present disclosure is simple in preparation and is relatively light and thin, thus overcoming problems of a complex preparation process and a low ultra-thin degree existing in the prior display panel.

In the embodiment of the present disclosure, after applying voltages to the first electrodes and the second electrodes, a pressure may be applied to a deformation layer corresponding to the second overlapping region, which changes a thickness of the deformation layer corresponding to the second overlapping region, thereby changing a pitch between the nanoparticles corresponding to the second overlapping region and the first electrode, so that a light absorption wavelength of the nanoparticles is changed. Therefore, absorption of light may be tuned by adjusting a voltage between the first electrodes and the second electrodes, achieving a color display of the display substrate. The TFT array substrate does not need to be prepared in the display substrate according to the embodiment of the present disclosure, and the process is simple and a degree of thinness is high.

In an embodiment of the present disclosure, the nanoparticles, the deformation layer, and the first electrodes form a structure with absorption characteristics, an energy of absorbed light may be localized in a deformation layer between the nanoparticles and the first electrodes, and utilizing light absorption characteristics of the nanoparticles, the deformation layer, and the first electrodes, and characteristics of absorbed light with different wavelengths related to a distance between the nanoparticles and the first electrodes, a thickness of the deformation layer is changed by applying different voltages to the first electrodes and the second electrodes, thereby changing absorptions of light with different wavelengths by the nanoparticles and the deformation layer, so that reflection or transmission of light with different colors is achieved.

Figure 2:
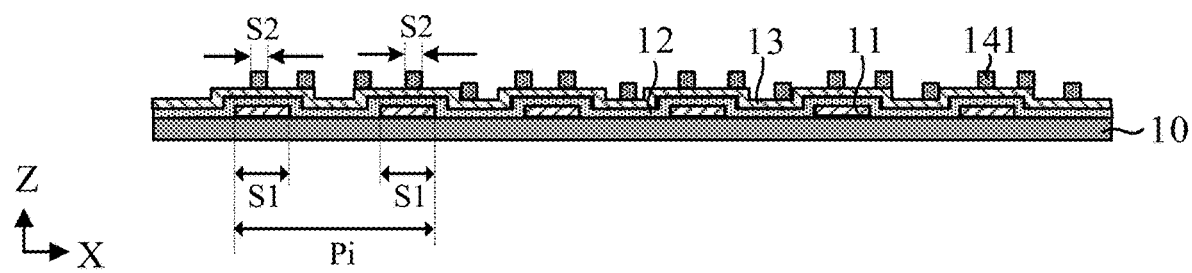
FIG. 2 shows a schematic diagram of a cross-sectional structure at position A-A in FIG. 1.

In an exemplary implementation, as shown in FIGS. 1 and 2, FIG. 2 shows a schematic diagram of a cross-sectional structure of position A-A in FIG. 1. The display substrate may include a base substrate 10, and a first conductive layer, a deformation layer 12, a second conductive layer, and a nanoparticle layer 14 stacked on the base substrate 10. The first conductive layer may include multiple first electrodes 11, the second conductive layer may include multiple second electrodes 13, and the nanoparticle layer 14 may include multiple nanoparticles 141. The display substrate may include multiple sub-pixels Pi defined by intersection of the multiple first electrodes 11 and the multiple second electrodes 13. There are multiple first overlapping regions S1 between an orthographic projection of the multiple first electrodes 11 on the base substrate 10 and an orthographic projection of the multiple second electrodes 13 on the base substrate 10, and there is a second overlapping region S2 between any one of the first overlapping regions S1 and an orthographic projection of at least one of the nanoparticles 141 on the base substrate 10. An orthographic projection of each sub-pixel Pi on the base substrate 10 at least partially overlaps with at least two adjacent second overlapping regions S2.

Figure 3A:
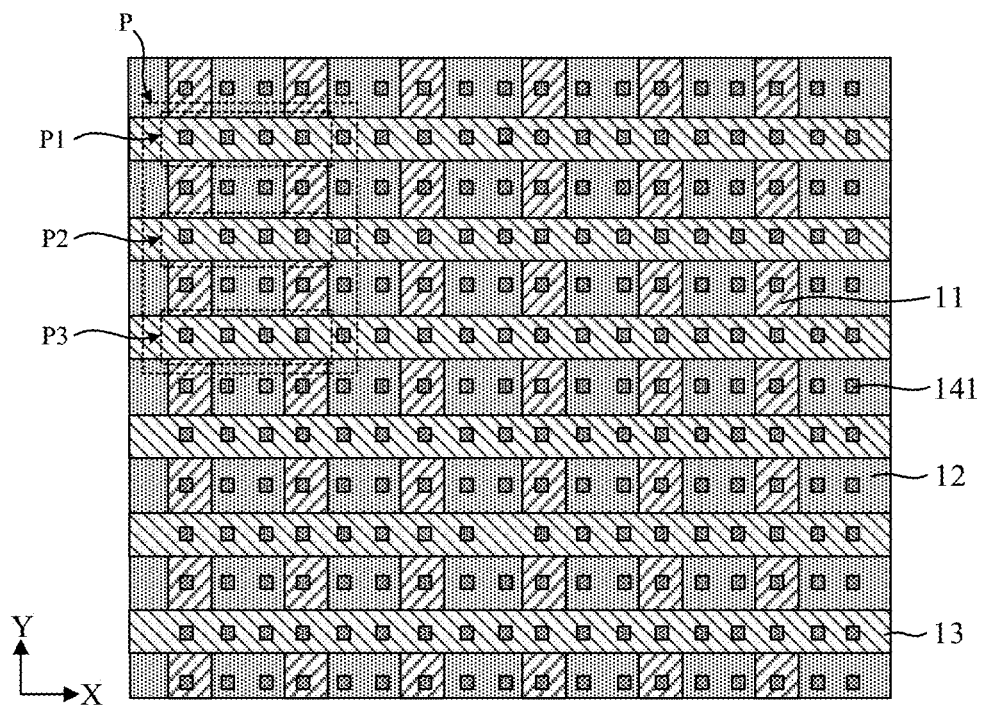
FIG. 3a shows a schematic diagram of a planar structure of a display substrate according to an exemplary embodiment of the present disclosure.
Figure 3B:
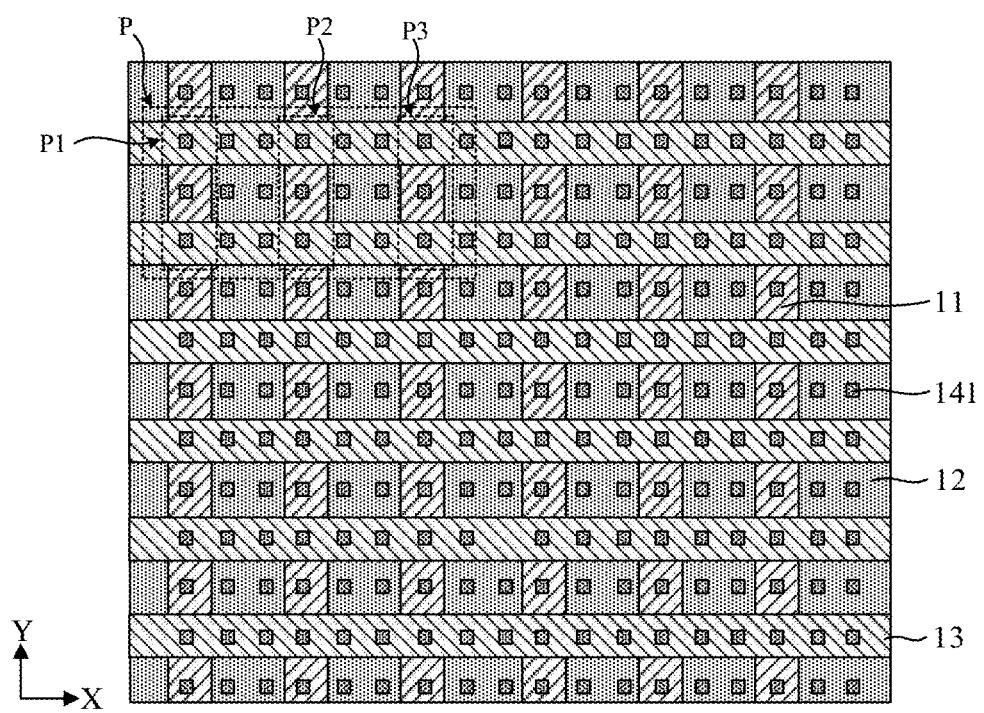
FIG. 3b shows a schematic diagram of a planar structure of a display substrate according to an exemplary embodiment of the present disclosure.

In an exemplary implementation, as shown in FIGS. 3a and 3b, an orthographic projection of each sub-pixel on the base substrate 10 at least partially overlaps with two adjacent second overlapping regions S2.

Figure 3C:
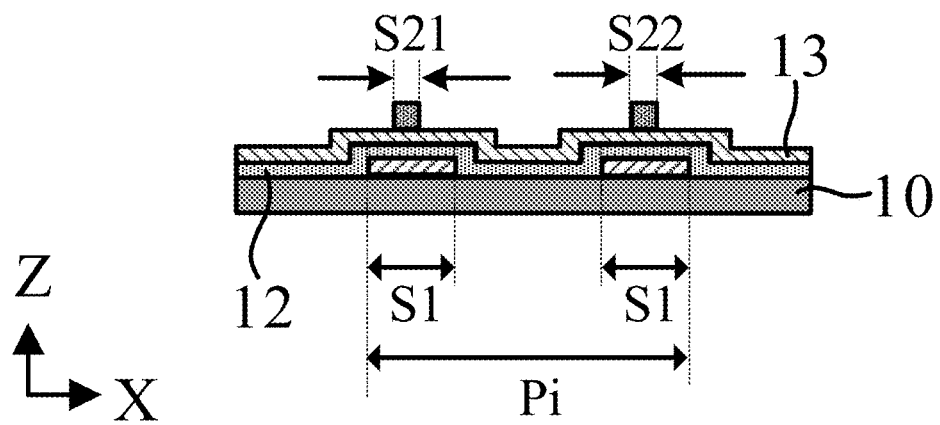
FIG. 3c shows a schematic diagram of a cross-sectional structure of a display substrate at a position of a sub-pixel according to an exemplary embodiment of the present disclosure.

In structures shown in FIGS. 3a and 3b, a light emitting principle is as shown in FIG. 3c, and each sub-pixel Pi is controlled by the nanoparticles 141 corresponding to two second overlapping regions S21 and S22, the first electrode 11, the second electrode 13, and the deformation layer 12 to absorb light of a corresponding wavelength, achieving reflection or transmission of light of corresponding colors, so as to achieve color display of the display substrate. For example, in a case of reflecting or transmitting red light by the sub-pixel shown in FIG. 3c, the second overlapping region S21 may be configured to absorb green light, and the second overlapping region S22 may be configured to absorb blue light. In a case that the display substrate displays red light (reflective display or transmissive display) and supplies a certain voltage to the second electrode 13, a voltage for absorbing green light is supplied to the first electrode 11 corresponding to the second overlapping region S21, then a position of the second overlapping region S21 reflects or transmits blue light and red light, or a voltage for absorbing blue light is supplied to the first electrode 11 corresponding to the second overlapping region S22, then the position of the second overlapping region S22 reflects or transmits green light and red light, wherein an energy of the reflected or transmitted red light is greater than an energy of the green and the blue, so that the sub-pixel Pi displays red visually.

Figure 4A:
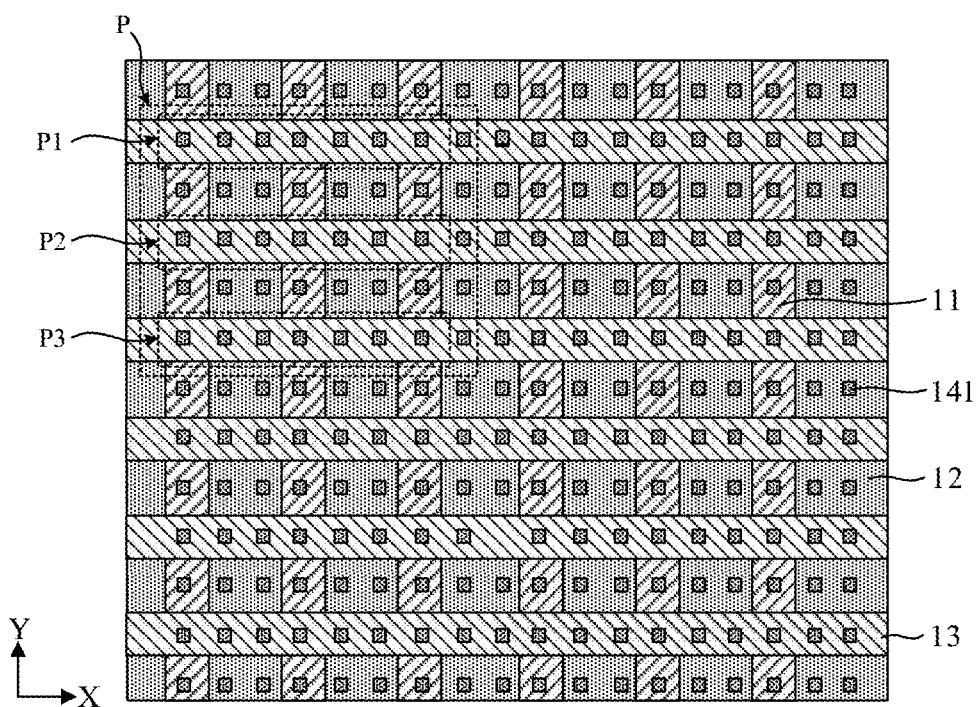
FIG. 4a shows a schematic diagram of a planar structure of a display substrate according to an exemplary embodiment of the present disclosure.
Figure 4B:
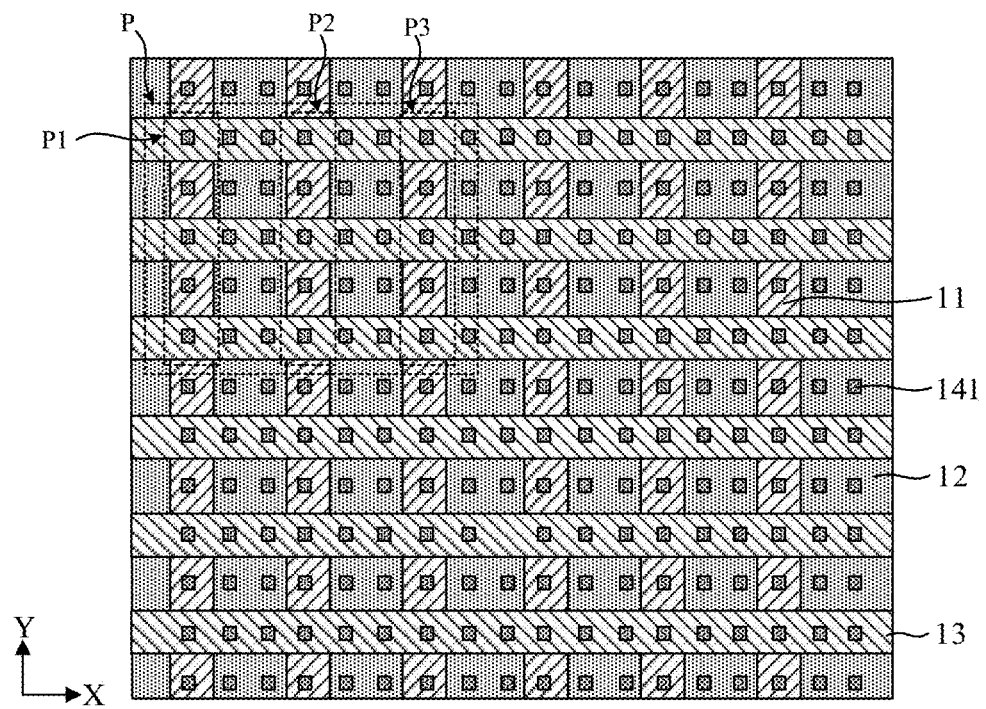
FIG. 4b shows a schematic diagram of a planar structure of a display substrate according to an exemplary embodiment of the present disclosure.

In another implementation, as shown in FIGS. 4a and 4b, an orthographic projection of each sub-pixel on the base substrate 10 at least partially overlaps with three adjacent second overlapping regions S2.

Figure 4C:
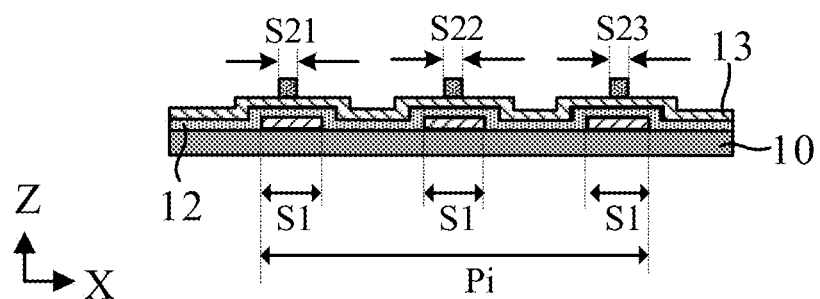
FIG. 4c shows a schematic diagram of a cross-sectional structure of a display substrate at a position of a sub-pixel according to an exemplary embodiment of the present disclosure.

In structures shown in FIGS. 4a and 4b, a light emitting principle is as shown in FIG. 4c, and each sub-pixel Pi is controlled by the nanoparticles 141 corresponding to three second overlapping regions S21, S22, and S23, the first electrode 11, the second electrode 13, and the deformation layer 12 to absorb light of a corresponding wavelength, achieving reflecting or transmitting of light of corresponding colors, so as to achieve color display of the display substrate. For example, in a case of reflecting or transmitting red light by the sub-pixel shown in FIG. 4c, the second overlapping region S21 may be configured to absorb green light, the second overlapping region S22 may be configured to absorb blue light, and the second overlapping region S23 may be configured to absorb green light. In a case that the display substrate displays red light (reflective display or transmissive display) and supplies a certain voltage to the second electrode 13, a voltage for absorbing green light is supplied to the first electrode 11 corresponding to the second overlapping region S21, then a position of the second overlapping region S21 reflects or transmits blue light and red light, or a voltage for absorbing blue light is supplied to the first electrode 11 corresponding to the second overlapping region S22, then a position of the second overlapping region S22 reflects or transmits green light and red light, or a voltage for absorbing green light is supplied to the first electrode 11 corresponding to the second overlapping region S23, then a position of the second overlapping region S23 reflects or transmits blue light and red light, wherein an energy of the reflected or transmitted red light is greater than an energy of the green and the blue, so that the sub-pixel Pi displays red visually. In a pixel unit illustrated in FIG. 4c, a quantity of sub-pixels is relatively large, which may cause an energy of a corresponding color reflected or transmitted is greater than an energy a color absorbed, to make the displayed color more obvious. Taking displaying red as an example, each sub-pixel includes four overlapping regions S2, and eventually a difference value between an energy of red light transmitted or reflected and an energy of green and blue light reflected or transmitted needs to be greater than a difference value of energies in case of each sub-pixel including two overlapping regions S2, so that the displayed red color is more obvious.

In an exemplary implementation, as shown in FIGS. 3a to 3b, 4a to 4b, the display substrate includes multiple pixel units P, wherein each pixel unit P may include multiple sub-pixels Pi, and in a same pixel unit P, an arrangement direction of the multiple sub-pixels is different from an arrangement direction of at least two adjacent second overlapping regions S2 in each sub-pixel. As shown in FIGS. 3a and 4a, three sub-pixels P1 to P3 in the same pixel unit P are arranged along a second direction Y, and multiple second overlapping regions S2 in each sub-pixel are arranged along a first direction X. As shown in FIGS. 3b and 4b, three sub-pixels P1 to P3 in the same pixel unit P are arranged in the first direction X, and multiple second overlapping regions S2 in each sub-pixel are arranged along the second direction Y.

In an exemplary implementation of the present disclosure, as shown in FIGS. 3a to 3b, 4a to 4b, each pixel unit P may include three sub-pixels Pi, wherein a value of i is 1, 2, 3, i.e. a first sub-pixel P1, a second sub-pixel P2, and a third sub-pixel P3. A quantity of sub-pixels in each pixel unit may not be limited to three, for example, four sub-pixels may be included in each pixel unit. In structures shown in FIGS. 3a to 3b, each pixel unit includes six adjacent second overlapping regions S2, and in structures shown in FIGS. 4a to 4b, each pixel unit includes nine adjacent second overlapping regions S2.

Figure 5A:
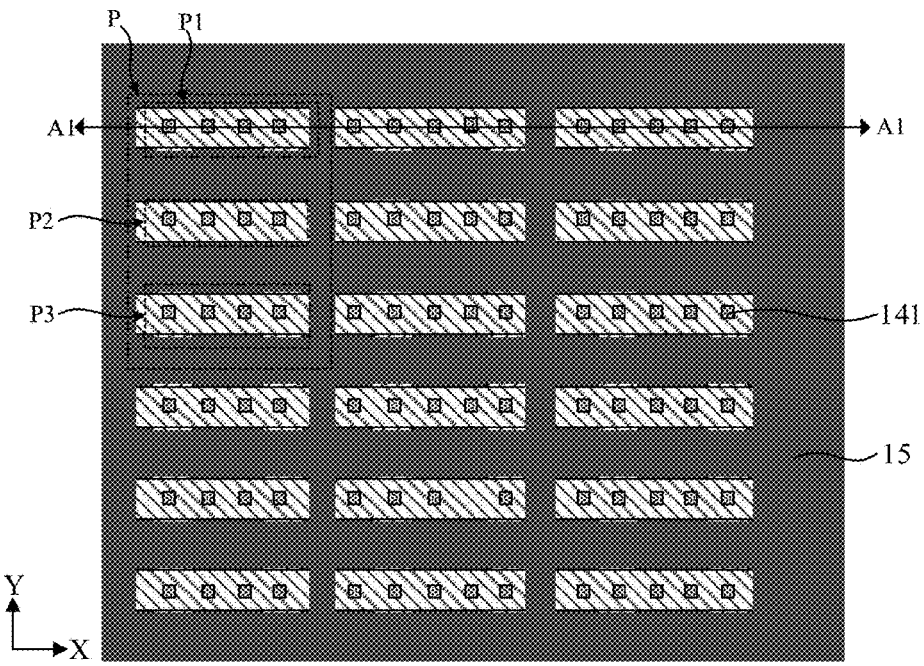
FIG. 5a shows a schematic diagram of a planar structure of a display substrate according to an exemplary embodiment of the present disclosure.
Figure 5B:
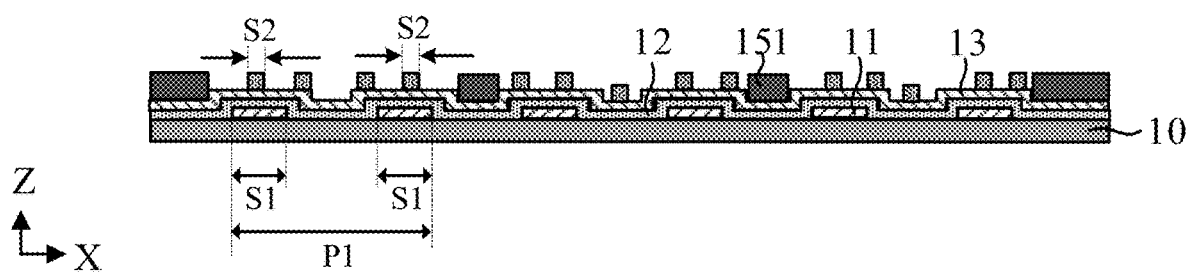

In an exemplary implementation of the present disclosure, as shown in FIGS. 5a and 5b, FIG. 5b is a schematic diagram of a cross-sectional structure at position A1-A1 in FIG. 5a, and the display substrate may further include a black matrix layer 15. The black matrix layer 15 may be disposed between the second conductive layer and the nanoparticle layer, or the black matrix layer 15 may be disposed at a side of the nanoparticle layer away from the second conductive layer. The black matrix layer 15 may include multiple black matrix structures 151, and multiple black matrix layers 15 are disposed between two adjacent sub-pixels. By isolating two adjacent sub-pixels by the black matrix structures 151, color crosstalk or color mixing of adjacent sub-pixels can be avoided.

In an exemplary implementation, as shown in FIGS. 6a to 6d, each first electrode 11 may be in a strip structure extending along a direction at a first included angle F1 with respect to the first direction X, and each second electrode 13 may be in a strip structure extending along a direction at a second included angle F2 with respect to the first direction X, wherein values of the first included angle F1 and the second included angle F2 range from 0° to 180°.

Figure 6A:
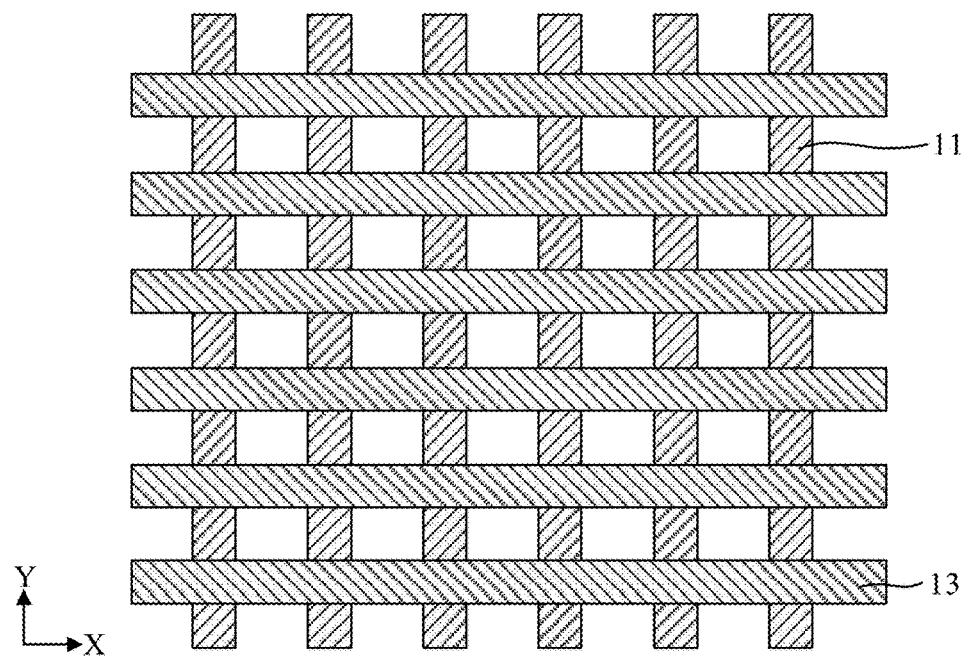
FIG. 6a shows a schematic diagram of an arrangement of a first electrode and a second electrode according to an exemplary embodiment of the present disclosure.

In an exemplary implementation, as shown in FIGS. 1 and 6a, FIG. 6a is a schematic diagram of an arrangement of the first electrode 11 and the second electrode 13 in FIG. 1, and in a plane where the display substrate is located, the first electrode 11 may extend along the second direction Y, and the second electrode 13 may extend along the first direction X, wherein the first direction X is perpendicular to the second direction Y. In a structure shown in FIG. 6a, the first included angle F1 is 0 degrees, and the second included angle F2 is 90 degrees.

Figure 6B:
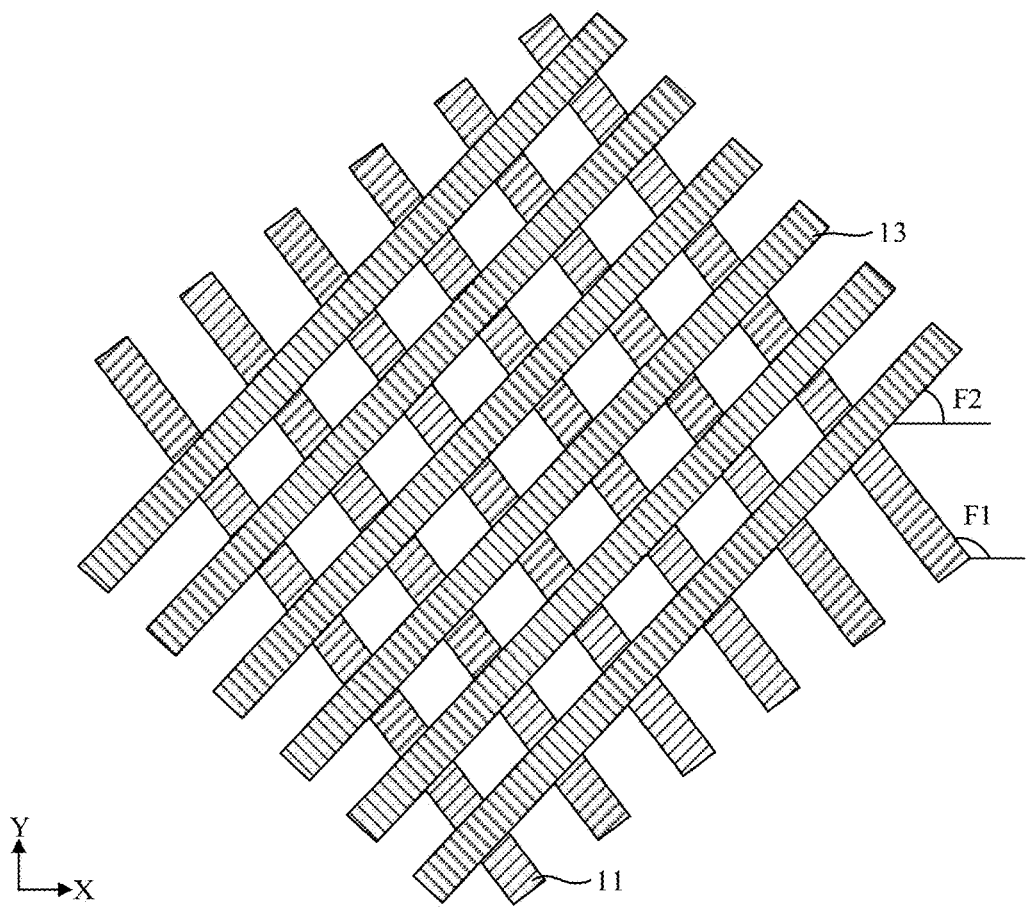
FIG. 6b shows a schematic diagram of an arrangement of a first electrode and a second electrode according to an exemplary embodiment of the present disclosure.
Figure 6C:
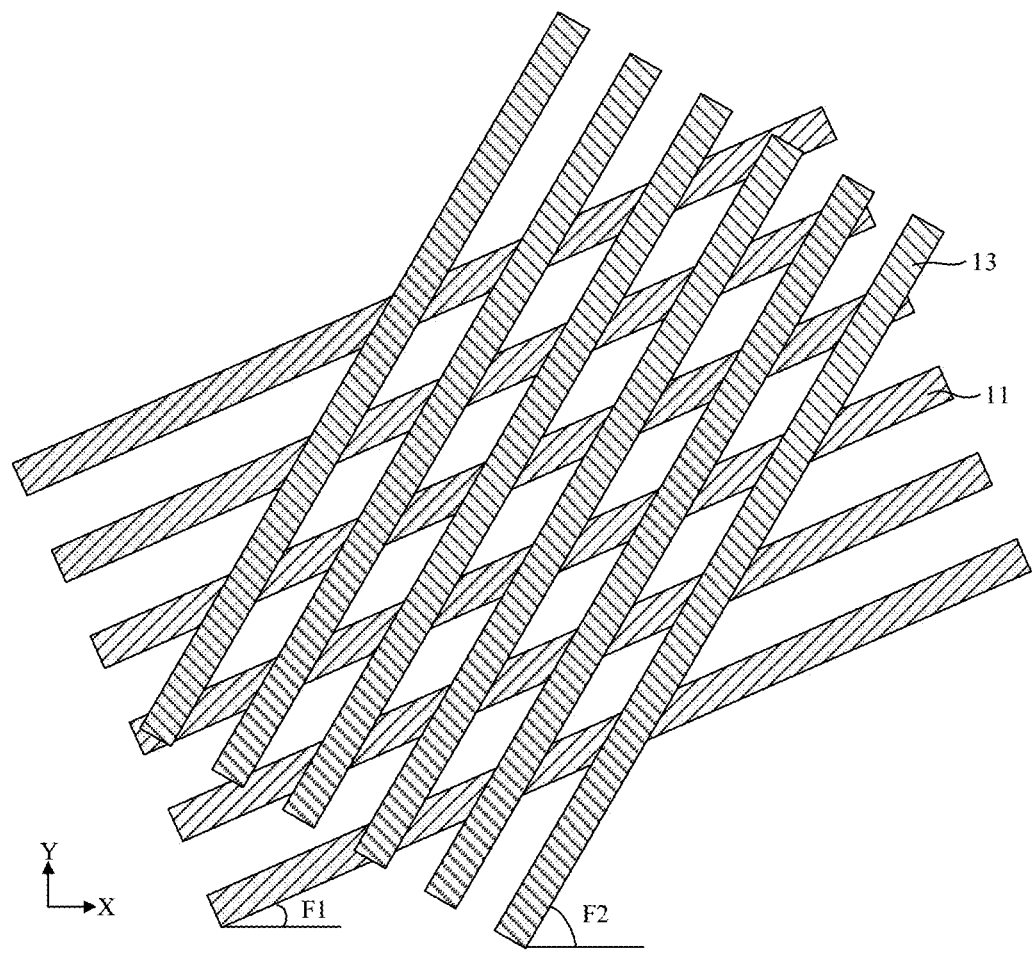
FIG. 6c shows a schematic diagram of an arrangement of a first electrode and a second electrode according to an exemplary embodiment of the present disclosure.
Figure 6D:
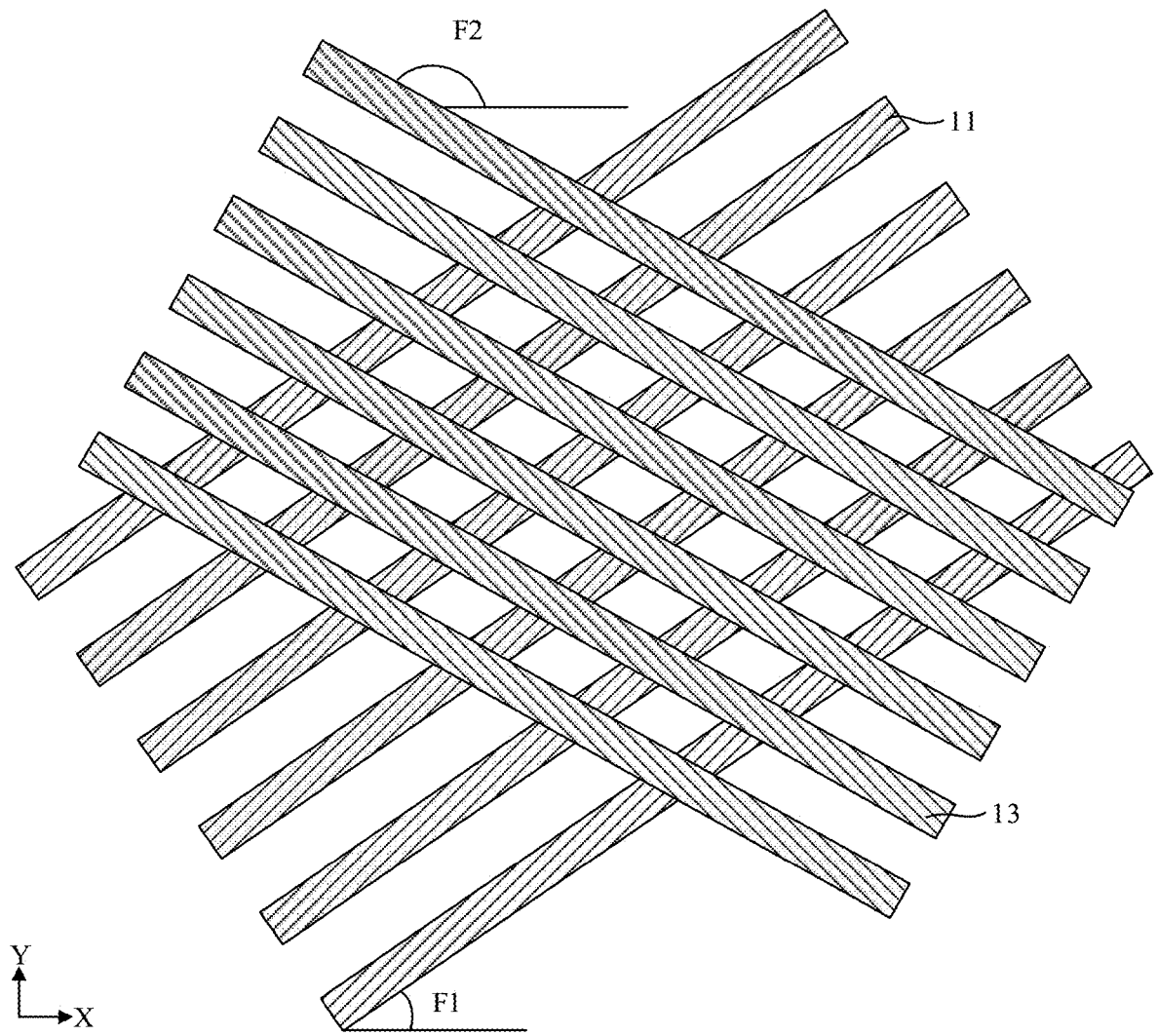
FIG. 6d shows a schematic diagram of an arrangement of a first electrode and a second electrode according to an exemplary embodiment of the present disclosure.

In an exemplary implementation, as shown in FIGS. 6b to 6d, the first electrode 11 extends along a direction at a first included angle F1 with the first direction X, and the second electrode 13 extends along a direction at a second included angle F2 with the first direction X. As shown in FIG. 6b, the first included angle F1 may be an obtuse angle, and the second included angle F2 may be an acute angle. As shown in FIG. 6c, the first included angle F1 and the second included angle F2 may both be acute angles, as shown in FIG. 6d, the first included angle F1 may be an acute angle, and the second included angle F2 may be an obtuse angle, wherein a range of the acute angle may be greater than 0 degrees and less than 90 degrees, and a range of the obtuse angle may be greater than 90 degrees and less than 180 degrees.

In a structure shown in FIG. 6a, an included angle between an orthographic projection of the first electrode 11 on the base substrate 10 and an orthographic projection of the second electrode 13 on the base substrate 10 may be a right angle. In structures shown in FIG. 6b to FIG. 6d, an included angle between the orthographic projection of the first electrode 11 on the base substrate and the orthographic projection of the second electrode 13 on the base substrate may be non-rectangular.

Figure 6E:
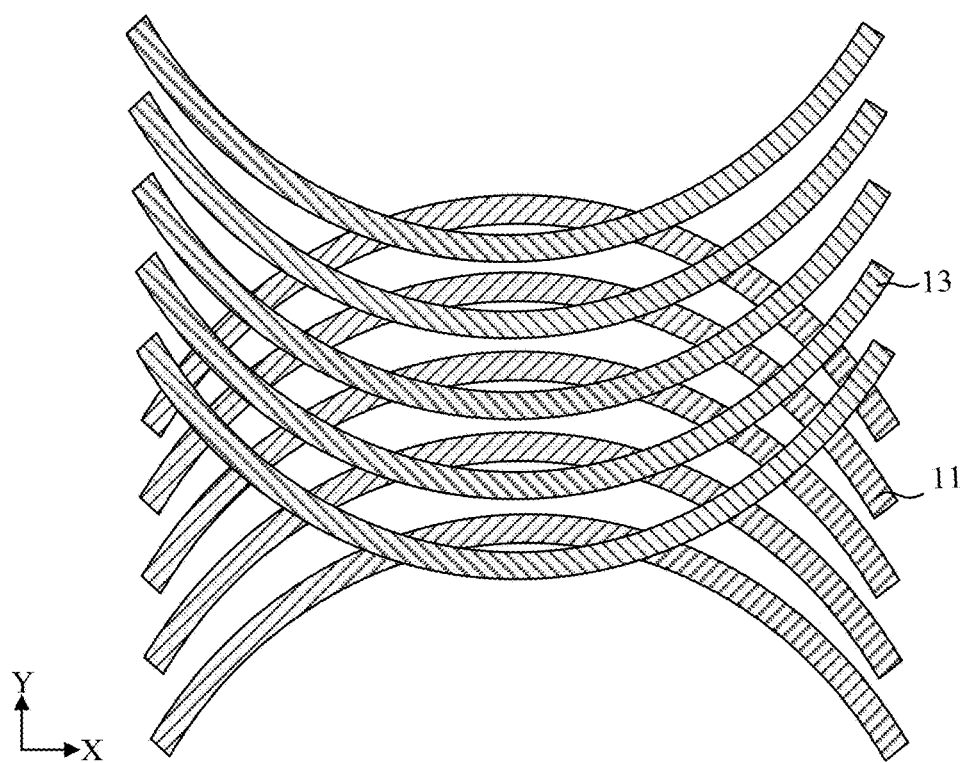
FIG. 6e shows a schematic diagram of an arrangement of a first electrode and a second electrode according to an exemplary embodiment of the present disclosure.
Figure 6F:
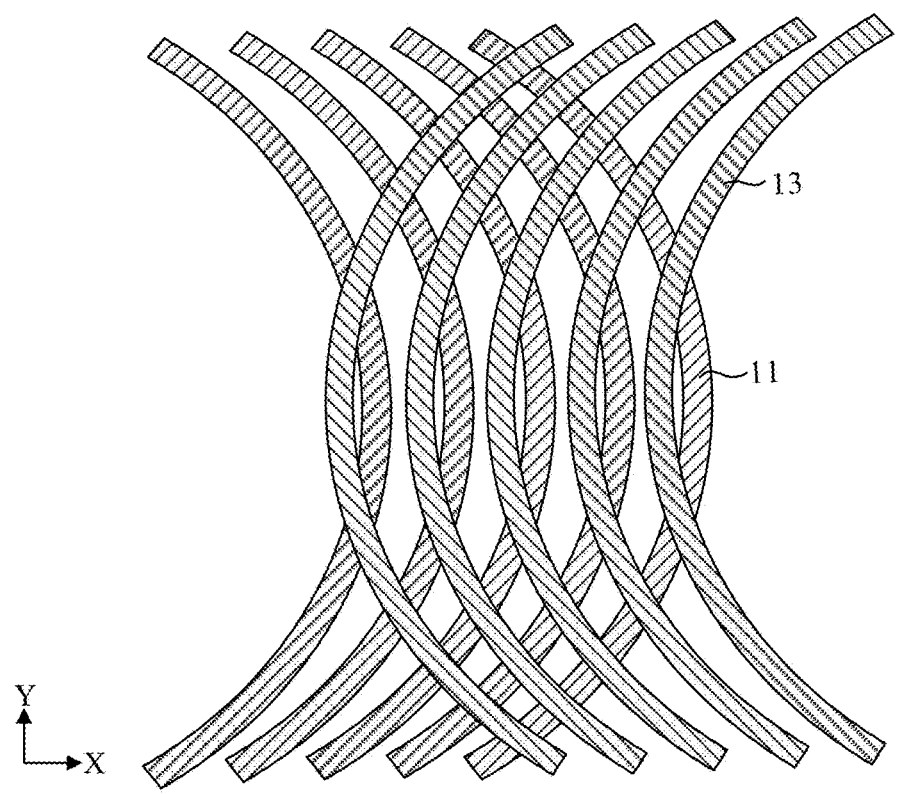
FIG. 6f shows a schematic diagram of an arrangement of a first electrode and a second electrode according to an exemplary embodiment of the present disclosure.

In an exemplary implementation, as shown in FIGS. 6e and 6f, the first electrode 11 and the second electrode 13 may both be an arc shape, a bending direction of an arc shape of the first electrode 11 is opposite to a bending direction of an arc shape of the second electrode 13, and multiple sub-pixels Pi may be arranged along the arc shape. For example, in FIG. 6e, the bending direction of the arc shape of the first electrode 11 may be bending toward a direction opposite to the second direction Y, and a curvature center of the arc shape of any one first electrode 11 is located at a side of the first electrode 11 in the second direction Y. A bending direction of the arc shape of the second electrode 13 may be bending toward the second direction Y, and a curvature center of the arc shape of any one second electrode 13 is located at a side of the second electrode 13 in the direction opposite to the second direction Y. In FIG. 6f, the bending direction of the arc shape of the first electrode 11 may be bending toward the first direction X, and the curvature center of the arc shape of any one first electrode 11 is located at a side of the first electrode 11 in the direction opposite to the first direction X. The bending direction of the arc shape of the second electrode 13 may be bending toward the direction opposite to the first direction X, and the curvature center of the arc shape of any one second electrode 13 is located at a side of the second electrode 13 in the first direction X.

In an exemplary implementation, the first electrode 11 may be formed on the base substrate 10 by electron beam evaporation.

In an exemplary implementation, the first electrode 11 and the second electrode 13 both have a light-transmitting structure. In this structure, since the first electrode 11 has a light-transmitting structure, a part of light incident from the second electrode 13 are absorbed by the nanoparticles and the deformation layer, while light not absorbed by the nanoparticles and the deformation layer 12 may be emitted out via the first electrode 11 and the base substrate 10.

In an exemplary implementation, the first electrode 11 may have a light-reflecting structure, and the second electrode 13 may have a light-transmitting structure. In this structure, since the first electrode 11 has a light-reflecting structure, a part of light incident from the second electrode 13 are absorbed by the nanoparticles and the deformation layer, while light not absorbed by the nanoparticles and the deformation layer is reflected by the first electrode 11 and then emitted out via the second conductive layer.

Figure 7:
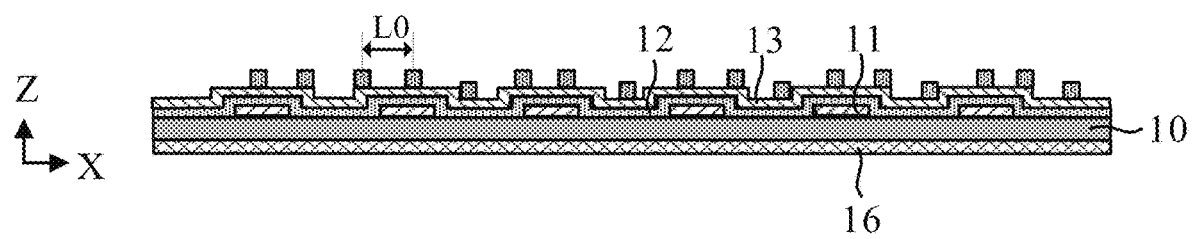
FIG. 7 shows a schematic diagram of a cross-sectional structure of a display substrate according to an exemplary embodiment of the present disclosure.

In an exemplary implementation, as shown in FIG. 7, the above display substrate may further include a reflective layer 16, and the reflective layer 16 is disposed at a side of the base substrate 10 away from the first conductive layer.

Figure 8:
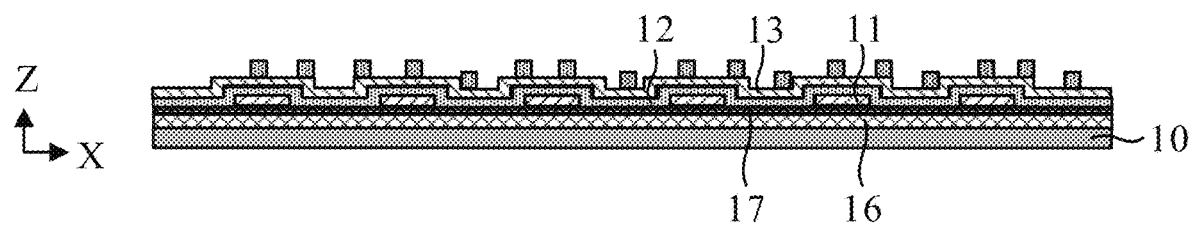
FIG. 8 shows a schematic diagram of a cross-sectional structure of a display substrate according to an exemplary embodiment of the present disclosure.

In an exemplary implementation, as shown in FIG. 8, the above display substrate may further include a reflective layer 16 and an insulating layer 17. The reflective layer 16 is disposed between the base substrate 10 and the insulating layer 17, and the insulating layer 17 is disposed between the reflective layer 16 and the first conductive layer.

In an exemplary implementation, the reflective layer 16 may be of a metal material quality, for example, the reflective layer 16 may be made of aluminum. In an exemplary implementation, in a structure as shown in FIG. 8, the insulating layer 17 is provided between the reflective layer 16 and the first conductive layer, which can avoid a short circuit with the reflective layer 16 after the first electrode 11 on the first conductive layer is energized.

In structures shown in FIG. 7 and FIG. 8, the second electrode 13 has a light-transmitting structure, and the first electrode 11 may have a light-transmitting structure or a light-reflecting structure. Since the reflective layer 16 is provided, light incident from the second electrode 13 are eventually reflected by the reflective layer 16 and then emitted out via the second electrode 13, thereby displaying a color of the reflected light at the side of the second electrode 13 on the display substrate.

In an exemplary implementation, the nanoparticles may be metal nanoparticles, for example, the nanoparticles may be silver (Ag) nanoparticles.

Figure 9A:
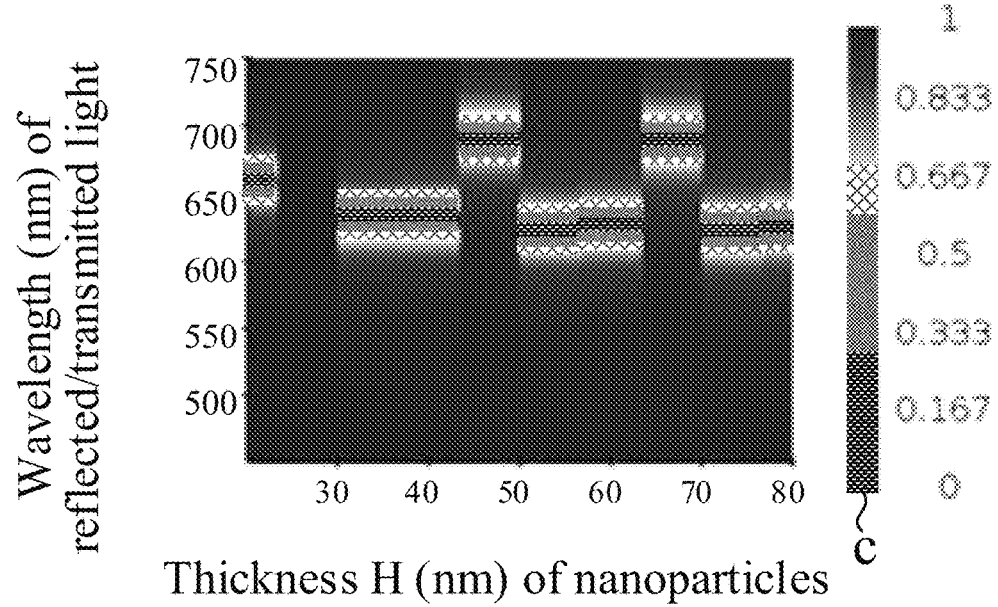
FIG. 9a shows a diagram of a relationship between a wavelength of reflected/transmitted light and a thickness of a nanoparticle according to an exemplary embodiment of the present disclosure.
Figure 9B:
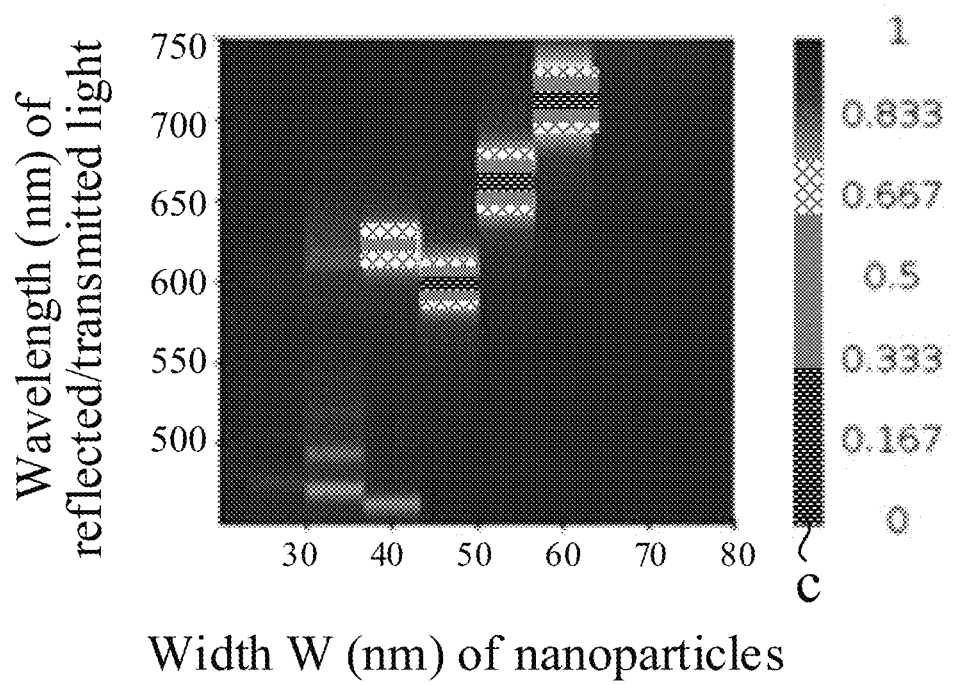
FIG. 9b shows a schematic diagram of a relationship between a wavelength of reflected/transmitted light and a width of a nanoparticle according to an exemplary embodiment of the present disclosure.
Figure 9C:
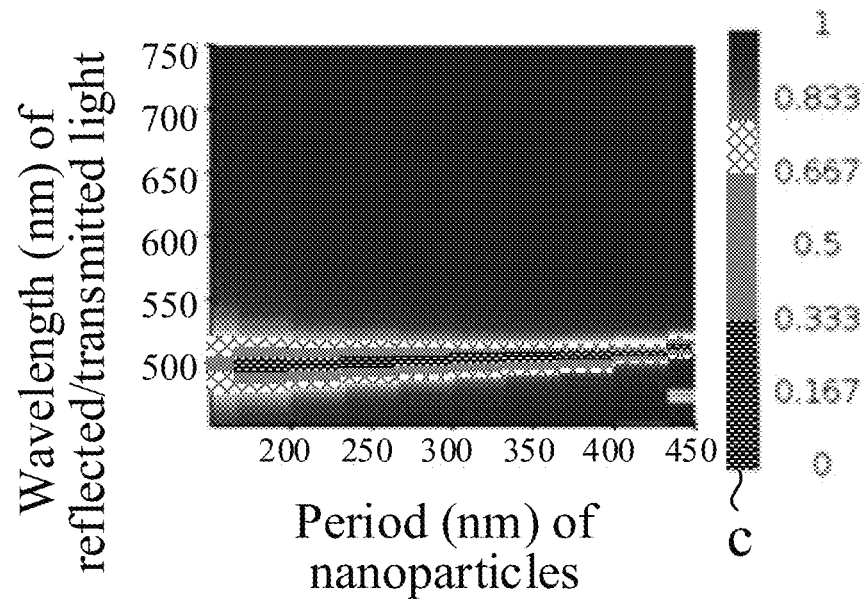
FIG. 9c shows a schematic diagram of a relationship between a wavelength of reflected/transmitted light and a period of a nanoparticle according to an exemplary embodiment of the present disclosure.
Figure 9D:
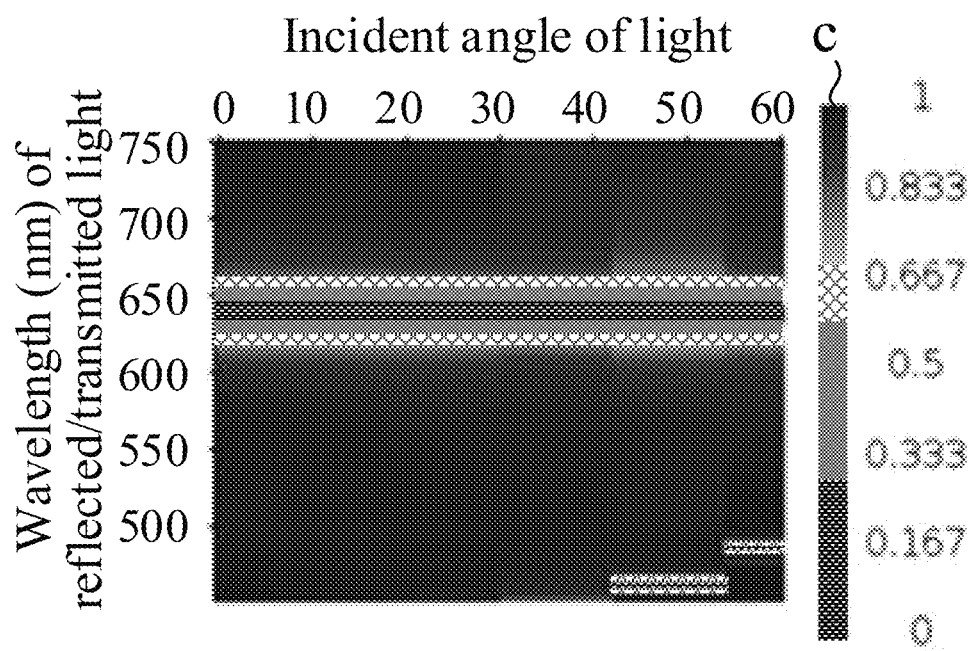
FIG. 9d shows a schematic diagram of a relationship between a wavelength of reflected/transmitted light and an incident angle of light according to an exemplary embodiment of the present disclosure.
Figure 9E:
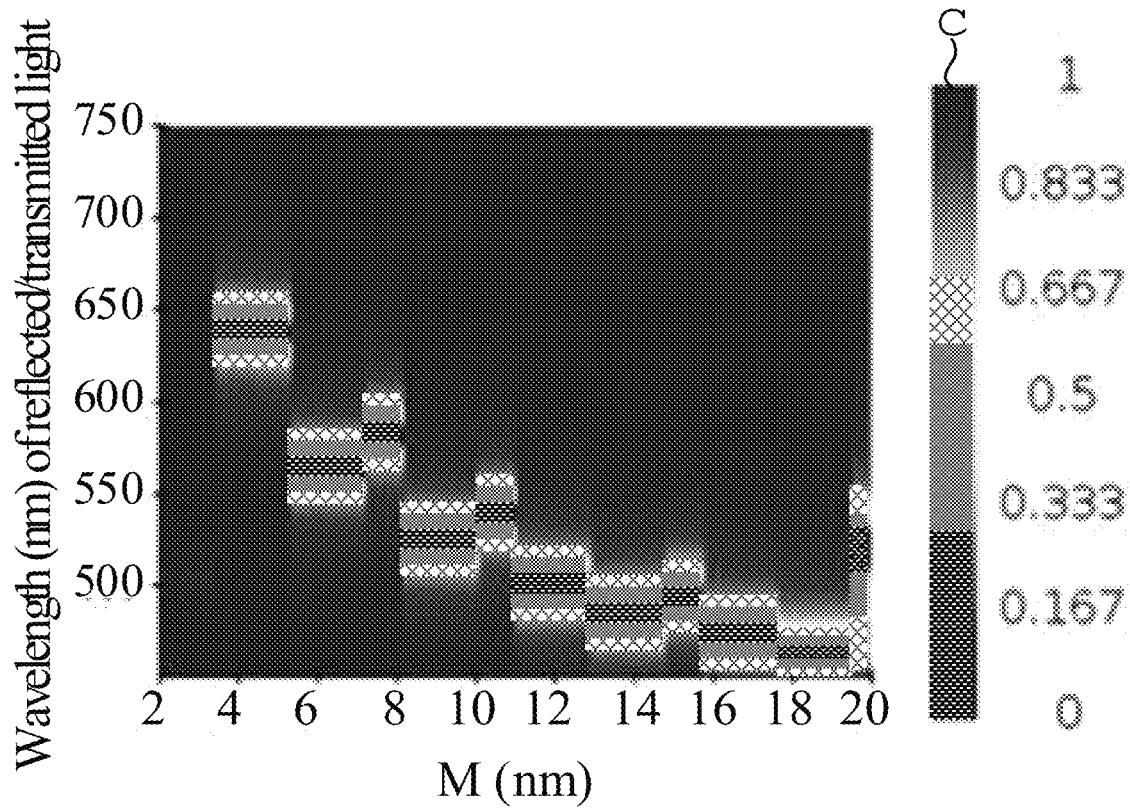
FIG. 9e shows a schematic diagram of a relationship between a wavelength of reflected/transmitted light and a distance M between a nanoparticle and a first electrode according to an exemplary embodiment of the present disclosure.
Figure 9F:
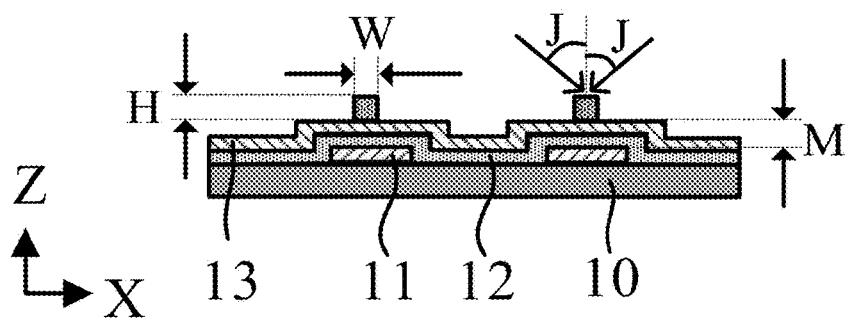
FIG. 9f shows a schematic diagram of a cross-sectional structure of a display substrate according to an exemplary embodiment of the present disclosure.

In an exemplary implementation, as shown in FIG. 9f, a thickness H of the nanoparticles 141 may be 30 nm to 80 nm, and a width W of the nanoparticles 141 may be 45 nm to 65 nm.

In an exemplary implementation, as shown in FIG. 7, the nanoparticles 141 are arranged periodically, and a distance L0 between center positions of two adjacent nanoparticles 141 is 200 nm to 400 nm.

In an exemplary implementation, as shown in FIG. 9f, a distance M between a side of the nanoparticles 141 facing the second conductive layer and a side of the first conductive layer facing the deformation layer 12 is 2 nm to 20 nm.

In an exemplary implementation, a voltage is applied to the deformation layer 12, by which an electrically activated polymer with deformation may appear, and the deformation layer 12 may be a dielectric elastomer, wherein the dielectric elastomer may be made of polyacrylate or silicone rubber, and a dielectric elastomeric layer may be formed by depositing a dielectric elastomer material (such as a polyacrylate material or a silicone rubber material) on the base substrate 10 on which the first conductive layer is formed by a layer-to-layer nano self-assembly process.

Since three primary colors of light include red, green, and blue, and wavelengths of light of different colors are different, in the embodiment of the present disclosure, light absorption characteristics of nanoparticles and dielectric elastomers are used, and wavelengths of absorbed light are different after a thickness of the deformation layer (which may be the dielectric elastomer) is changed after a voltage is applied, so as to achieve reflection or transmission of light of corresponding colors. Influence factors of reflection or transmission of light by nanoparticles and dielectric elastomers are explained below in combination with simulation model results.

(1) An influence of a thickness H of nanoparticles on reflection or transmission of light.

The thickness H of the nanoparticles (a size of a nanoparticle 141 along a third direction Z in FIGS. 2 and 9f) changes in a range of 30 nm to 80 nm, a changing trend of reflectivity or transmittance calculated by simulation is shown in FIG. 9a. An absorption spectrum of light may be obtained indirectly through reflection or transmission. A height of the nanoparticles 141 changes in a range of 50 nm to 80 nm, and an absorption wavelength changes only at a few discrete positions. It can be understood that the thickness of the nanoparticles is in a range of 50 nm to 80 nm, which has little influence on the reflectivity/transmittance of light.

For example, when the thickness H of the nanoparticles is about 48 nm, reflectivity or transmittance of light with a wavelength of about 700 nm is relatively low (in a range of 0 to 0.3), and a corresponding absorption rate is relatively large. In a range of the thickness of the nanoparticles of 30 nm to 80 nm, the absorption wavelength is about 630 nm (if the reflectivity or the transmittance is relatively low, which is about 0 to 0.3, an absorption rate is relatively high).

(2) An influence of a width W of the nanoparticles on the reflection or transmission of light.

The width W of the nanoparticles changes in a range of 45 nm to 65 nm. A changing trend of the reflectivity/transmittance calculated by simulation is shown in FIG. 9b. The change of the width W of the nanoparticles 141 will affect the absorption wavelength. In a range of the width of the nanoparticles of 45 nm to 65 nm, the absorption wavelength increases with the increase of the width of the nanoparticle. For example, the width of the nanoparticles is about 60 nm and the absorption wavelength is about 700 nm, while the width W of the nanoparticles is about 45 nm, and the absorption wavelength is about 700 nm.

In an exemplary implementation, as shown in FIG. 9f, the width W of the nanoparticles is a size of the nanoparticles 141 along the first direction X.

(3) An influence of a period of the nanoparticles on the reflection or transmission of light.

As shown in FIG. 9c, it is a changing trend of the reflectivity or the transmittance calculated and calculated by simulation when the period of the nanoparticles changes in a range of 200 nm to 400 nm, the absorption wavelength of the nanoparticles remains substantially unchanged, and the absorption wavelength is about 470 nm to 530 nm.

In an exemplary implementation, as shown in FIG. 9f, the period of the nanoparticles may be a distance R between centers of two adjacent nanoparticles.

(4) An influence of an incident angle J of light on the reflection or transmission of light.

As shown in FIG. 9d, the incident angle J of light is in a range of 0° (i.e., the incident angle of light is perpendicular to a surface of the nanoparticles) to 60°, and the absorption wavelength of the nanoparticles remains basically unchanged. As shown in FIG. 9c, the absorption wavelength of the nanoparticles is about 620 nm to 650 nm.

(5) An influence of a distance M between the nanoparticles and the second electrode 13 on the reflection or transmission of light.

As shown in FIG. 9e, an abscissa M is a distance between the nanoparticles 141 and the second electrode 13 in FIG. 9f. A value of M is in a range of 4 nm to 20 nm, which can achieve absorption of light with a value of a wavelength of 400 nm to 650 nm. A thickness of the dielectric elastomer may be adjusted by applying different voltages to the first electrode 11 and the second electrode 13, so that it can be achieved that light with different wavelength ranges are controllably absorbed to achieve color display of the display substrate. As shown in FIG. 9e, the value of M is basically linearly related to a value of a wavelength of the absorbed light, and the wavelength of the absorbed light has a trend of gradually decreasing as the value of M increases in the value range of M of 4 nm to 20 nm.

In an embodiment of the present disclosure, the value of M may be determined according to a wavelength range of the three primary colors of red, green, and blue, and a wavelength of red light is about 650 nm, corresponding to the value of M in FIG. 9e being about 4 nm to 5.2 nm; a wavelength range of green light is about 532 nm, corresponding to the value of M in FIG. 9e being about 8 nm to 10 nm; a wavelength range of blue light is about 445 nm to 450 nm, corresponding to the value of M in FIG. 9e being about 18 nm to 20 nm. According to this, different voltages are applied to the first electrode 11 and the second electrode 13 corresponding to the second overlapping region S2 in a corresponding sub-pixel. For example, according to a display status of a sub-pixel, a required voltage is a first voltage U1 in a case that the second overlapping region S2 is set to absorb red light, a required voltage is a second voltage U2 in a case that the second overlapping region S2 is set to absorb green light, a required voltage is a third voltage U3 in a case that the second overlapping region S2 is set to absorb blue light. Since values of M corresponding to red, green, and blue increases in turn, a deformation of a corresponding dielectric elastomer also increases, and the required voltage also increases. Therefore, voltage values of the first voltage U1, the second voltage U2, and the third voltage U3 increase in turn.

In FIGS. 9a to 9e, shades of color in c represent reflectivity or transmittance, and the reflectivity and the transmittance are inversely proportional to absorptivity in an embodiment of the present disclosure. For example, in FIGS. 9a to 9e, the reflectivity/transmittance is higher, then it represents that the absorptivity is lower, and if the reflectivity/transmittance is lower, then it represents that the absorptivity is higher. In an embodiment of the present disclosure, the display substrate may be a transmissive display or a reflective display. In a case of the reflective display, there are two main destinations of a total energy of light received by the nanoparticles and the dielectric elastomer: one is absorbed by the nanoparticles and the dielectric elastomer, and the other is reflected by at least one of the first electrode 11 and the reflective layer 16. The reflectivity can be understood as a ratio of energy of the reflected light to the total energy of the received light. In a case of the transmissive display, there are two main destinations for the total energy of light received by the nanoparticles and the dielectric elastomer: one is absorbed by the nanoparticles and the dielectric elastomer, and the other is emitted out via the first electrode 11. The transmittance can be understood as a ratio of an energy of transmitted light to the total energy of the received light. Herein, values of the reflectivity and the transmittance range from 0 to 1.

In an embodiment of the present disclosure, the base substrate 10 may be made of a transparent material quality, such as transparent glass.

Exemplary description is made below through a preparation process of a display substrate. A "patterning process" mentioned in the present disclosure includes coating with a photoresist, a mask exposure, a development, etching, photoresist stripping, and other treatments for a metal material, an inorganic material, or a light-transmitting conductive material, or includes coating with an organic material, a mask exposure, a development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary implementation, a process for preparing the display substrate may include the following operations.

(11) Forming a pattern of a first conductive layer.

Figure 10:
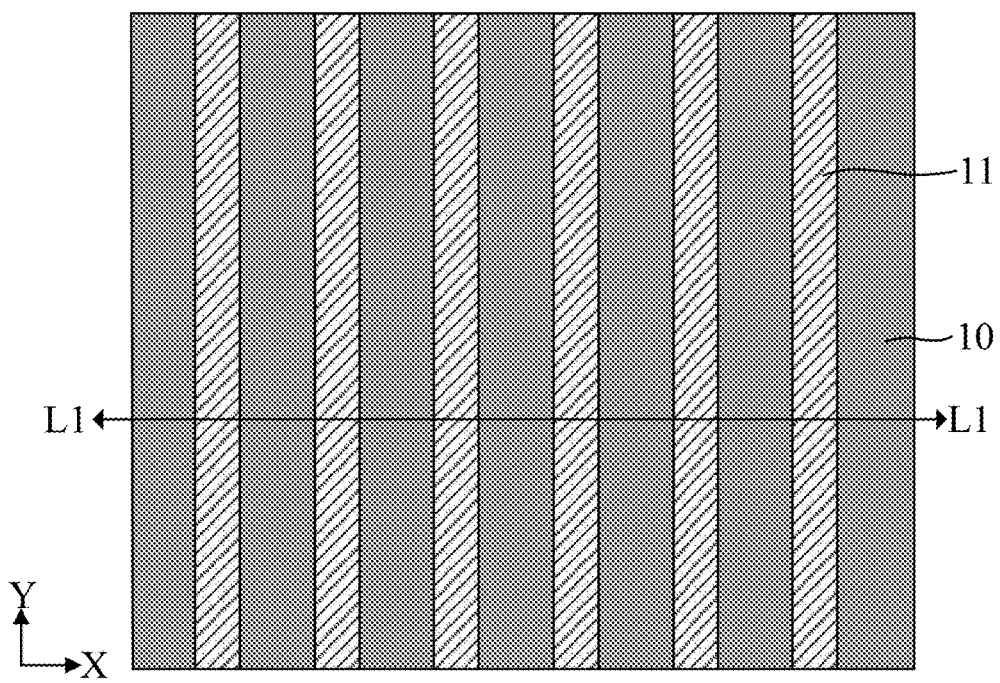
FIG. 10 shows a schematic diagram of a planar structure in which a pattern of a first conductive layer is formed according to an exemplary embodiment of the present disclosure.
Figure 11:
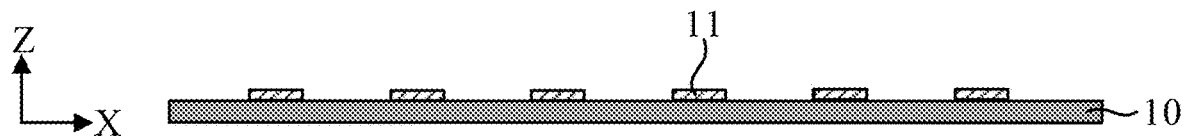
FIG. 11 shows a schematic diagram of a cross-sectional structure at position L1-L1 in FIG. 10.

In an exemplary implementation, the pattern of the first conductive layer is formed, which may include: a first conductive thin film is formed on a base substrate 10, the first conductive thin film is patterned by a patterning process to form the pattern of the first conductive layer disposed on the base substrate 10, and the pattern of the first conductive layer may include multiple first electrodes 11 arranged along a first direction X and extending along a second direction Y, as shown in FIGS. 10 and 11, FIG. 11 is a schematic diagram of a cross-sectional structure of position L1-L1 in FIG. 10.

In an exemplary implementation, the first conductive thin film is patterned by a patterning process, which may include: a layer of photoresist is coated on the first conductive thin film, the photoresist is exposed and developed using a mask plate, an unexposed region is formed at positions of the first electrodes 11, the photoresist is retained, and a fully exposed region is formed at a remaining position without photoresist; the first conductive thin film in the fully exposed region is removed by an etching process, and the remaining photoresist is stripped off to form the first electrodes 11.

(12) A dielectric elastomeric layer is formed.

Figure 12:
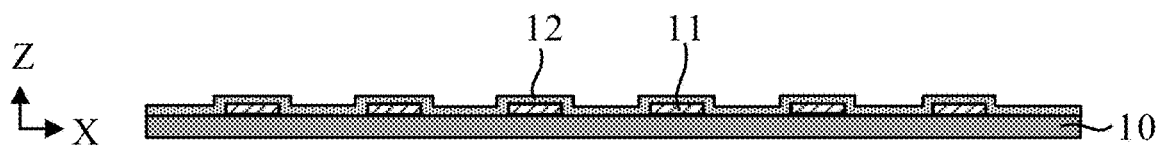
FIG. 12 shows a schematic diagram of a cross-sectional structure in which a dielectric elastomeric layer is formed according to an exemplary embodiment of the present disclosure.

In an exemplary implementation, the dielectric elastomeric layer is formed, which may include: a dielectric elastomer material is deposited on the base substrate 10 on which the aforementioned pattern is formed to form the dielectric elastomeric layer, as shown in FIG. 12, 12 is the dielectric elastomeric layer. In an exemplary implementation, the dielectric elastomeric layer 12 may be formed by depositing the dielectric elastomer material on the base substrate 10 on which the pattern of the first conductive layer is formed by a layer-to-layer nano self-assembly process.

In an exemplary implementation, the nano self-assembly process means that the dielectric elastomer material spontaneously organizes to form the dielectric elastomeric layer on the base substrate on which the pattern of the first conductive layer is formed without human interference.

(13) A pattern of a second conductive layer is formed.

Figure 13:
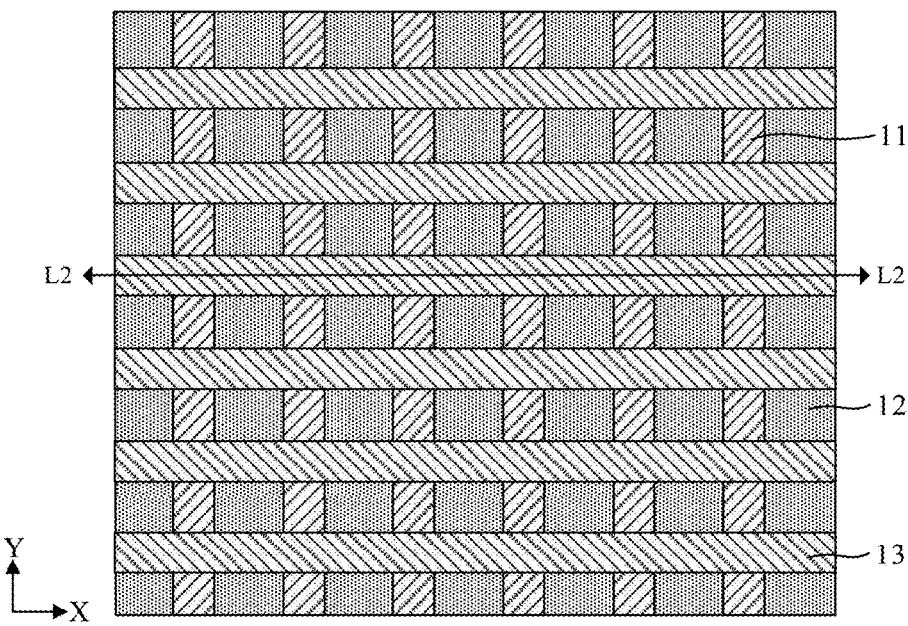
FIG. 13 shows a schematic diagram of a planar structure in which a pattern of a second conductive layer is formed according to an exemplary embodiment of the present disclosure.
Figure 14:
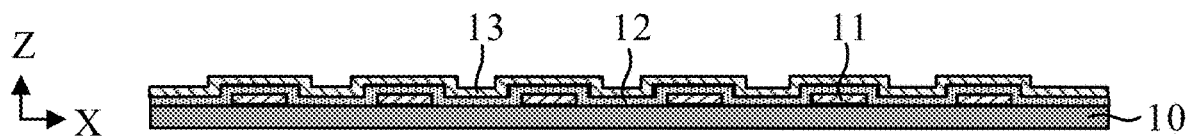
FIG. 14 shows a schematic diagram of a cross-sectional structure at position L2-L2 in FIG. 13.

In an exemplary implementation, the pattern of the second conductive layer is formed, which may include: a second conductive thin film is deposited on the base substrate 10 on which the aforementioned patterns are formed, the second conductive thin film is patterned by a patterning process to form the pattern of the second conductive layer disposed on the dielectric elastomeric layer, and the pattern of the second conductive layer may include multiple second electrodes 13 arranged along the second direction Y and extending along the first direction X, as shown in FIGS. 13 and 14, FIG. 14 being a schematic diagram of a cross-sectional structure of position L2-L2 in FIG. 13.

In an exemplary implementation, the second conductive thin film is patterned by a patterning process, which may include: a layer of photoresist is coated on the second conductive thin film, the photoresist is exposed and developed using a mask plate, an unexposed region is formed at positions of the second electrodes 13, the photoresist is retained, and a fully exposed region is formed at a remaining position without photoresist; the second conductive thin film in the fully exposed region is removed by an etching process, and the remaining photoresist is stripped off to form the second electrodes 13.

In an exemplary implementation, the first conductive thin film may be deposited on the base substrate 10 by electron beam evaporation, and the first conductive thin film may be an indium tin oxide semiconductor light-transmitting conductive film, for example, indium tin oxide may be Indium Tin Oxides (English full name, abbreviated as ITO).

(14) A nanoparticle layer is formed.

Figure 15:
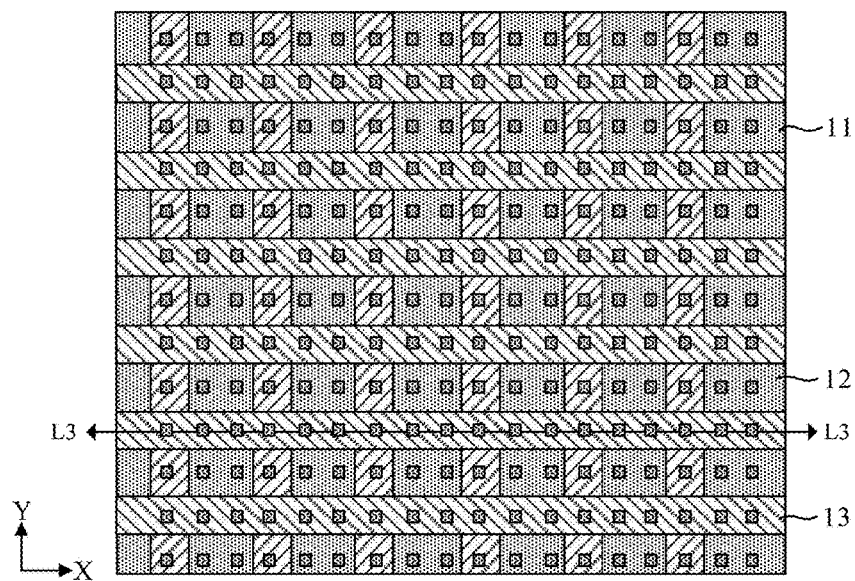
FIG. 15 shows a schematic diagram of a planar structure in which a nanoparticle layer is formed according to an exemplary embodiment of the present disclosure.

In an exemplary implementation, the nanoparticle layer is formed, which may include: the nanoparticle layer 14 is formed by coating the nanoparticles on the base substrate 10 on which the aforementioned pattern is formed in a dot spin coating mode. In an exemplary implementation, the nanoparticles 141 may be metal nanoparticles, such as silver (Ag) nanoparticles. As shown in FIG. 14 and FIG. 15, FIG. 15 shows a schematic diagram of a cross-sectional structure of position L3-L3 in FIG. 14.

In exemplary implementation, the nanoparticle layer is formed, which may also include a step of drying the nanoparticle layer in a nitrogen atmosphere or the like.

In an exemplary implementation, the first conductive thin film may be a light-transmitting conductive thin film, for example, an indium tin oxide semiconductor light-transmitting conductive film, and the indium tin oxide may be Indium Tin Oxides (English full name, abbreviated as ITO); and in another exemplary implementation, the above first conductive thin film may reflect a conductive thin film, for example, it may be a metal conductive thin film, wherein the metal may be one of gold, silver, and aluminum.

In an exemplary implementation, the first conductive thin film and the second conductive thin film are both light-transmitting conductive thin films, and the obtained first electrodes and the second electrodes are both in a light-transmitting structure, so that a transmission-type display substrate can be prepared.

In an exemplary implementation, the second conductive thin film is a light-transmitting conductive thin film, and the first conductive thin film is a reflection-type conductive thin film, so that a reflection-type display substrate can be prepared.

In an exemplary implementation, before the above step (11), it may also include that: a reflective layer is formed at a side of the base substrate 10 away from the first conductive layer, the reflective layer may be metal, for example aluminum; or, before the above step (11), it may also include: a reflective layer and an insulating layer are formed between the base substrate 10 and the first conductive layer, wherein the reflective layer may be metal, such as aluminum. In an embodiment of the present disclosure, the reflection-type display substrate is formed after the reflective layer is prepared on the base substrate 10.

In an embodiment of the present disclosure, for the transmission-type display substrate, a display screen is at a side of the display substrate away from incident light, that is, after light are incident at a side of the display substrate, the light are absorbed by the dielectric elastomeric layer, and then the light are emitted out at another side of the display substrate to form the display screen. For the reflection-type display substrate, a display screen is at a side of the display substrate facing incident light, that is, after light are incident at a side of the display substrate, the light are absorbed by the dielectric elastomeric layer, and then the light are reflected by the reflective layer or the first electrode in the display substrate, and then emitted out at a side of the incident light to form the display screen.

In an exemplary implementation, before or after the above step (14), it may also include: a black matrix layer 15 is formed on the base substrate 10 on which the pattern of the second conductive layer is formed, wherein the black matrix layer includes multiple black matrix structures 151, as shown in FIGS. 5a and 5b.

Figure 16:
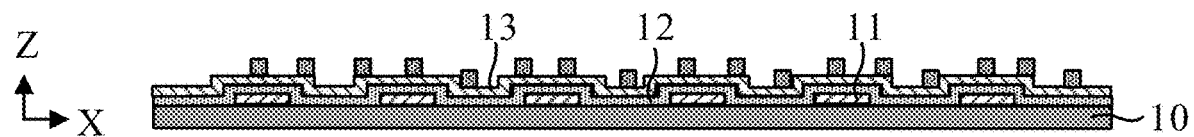
FIG. 16 shows a schematic diagram of a cross-sectional structure at position L3-L3 in FIG. 15.

In an embodiment of the present disclosure, a total thickness of the first conductive layer, the deformation layer, the second conductive layer, and the nanoparticle layer in the display substrate (i.e., a sum of sizes of the first conductive layer, the deformation layer, the second conductive layer, and the nanoparticle layer along the third direction Z in FIG. 16) does not exceed 200 nm, which can cause the display substrate be sufficiently thin and light.

An embodiment of the present disclosure further provides a display apparatus, which may include the display substrate described in any one of the aforementioned embodiments.

In an implementation of the present disclosure, the display apparatus may be a mobile phone, a computer, a television (TV), a medical monitoring apparatus, a vehicle-mounted central control apparatus, a monitor, a notebook computer, a digital photo frame, a navigator, and other products or components with display functions.

An embodiment of the present disclosure further provides a method for driving a display substrate, which drives the display substrate described in any one of the above embodiments. The driving method may include: different voltages are applied to multiple first electrodes and multiple second electrodes to cause the deformation layer between the first electrodes and the second electrodes to generate different degrees of deformation.

An embodiment of the present disclosure further provides a method for preparing a display substrate, which may include: a first conductive layer is formed at a side of a base substrate, wherein the first conductive layer includes multiple first electrodes arranged in parallel; a deformation layer is formed at a side of the first conductive layer away from the base substrate; a second conductive layer is formed at a side of the deformation layer away from the first conductive layer, wherein the second conductive layer includes multiple second electrodes arranged in parallel; and a nanoparticle layer is formed at a side of the second conductive layer away from the deformation layer, wherein the nanoparticle layer includes multiple nanoparticles; wherein the display substrate includes multiple sub-pixels cross-defined by the first electrodes and the second electrodes; multiple first overlapping regions exist in an orthographic projection of the multiple first electrodes and the multiple second electrodes on the base substrate, a second overlapping region exists between any one of the first overlapping regions and an orthographic projection of at least one of the nanoparticles on the base substrate; and an orthographic projection of each sub-pixel on the base substrate at least partially overlaps with at least two adjacent second overlapping regions.

In an exemplary implementation, the first electrodes are formed on the base substrate using an electron beam evaporation process.

In an exemplary implementation, the deformation layer is formed at the side of the first conductive layer away from the base substrate using a nano self-assembly process.

In an exemplary embodiment, the nanoparticle layer is formed at the side of the second conductive layer away from the deformation layer using a point spin coating process.

A display substrate and a method for driving the display substrate, a preparation method, and a display apparatus according to an embodiment of the present disclosure include a first conductive layer, a deformation layer, a second conductive layer, and a nanoparticle layer stacked on a base substrate, wherein the first conductive layer includes multiple first electrodes, the second conductive layer includes multiple second electrodes, multiple first overlapping regions exist in an orthographic projection of the multiple first electrodes and the multiple second electrodes on the base substrate, and a second overlapping region exists between any one of the first overlapping regions and an orthographic projection of at least one nanoparticle on the base substrate; and an orthographic projection of each sub-pixel on the display substrate on the base substrate at least partially overlaps with at least two adjacent second overlapping regions. The display substrate according to the embodiment of the present disclosure is simple in preparation and relatively light and thin, thus overcoming problems of a complex preparation process and a low ultra-thin degree existing in the prior display panel.

The drawings of the embodiments of the present disclosure only involve structures involved in the embodiments of the present disclosure, and other structures may refer to usual designs.

The embodiments of the present disclosure, that is, features in the embodiments, may be combined with each other to obtain new embodiments if there is no conflict.

Although the implementations disclosed in the embodiments of the present disclosure are described above, contents are only implementations for facilitating understanding of the embodiments of the present disclosure, which are not intended to limit the embodiments of the present disclosure. Those of skilled in the art to which the embodiments of the present disclosure pertain may make any modifications and variations in forms and details of implementation without departing from the spirit and scope of the embodiments of the present disclosure. Nevertheless, the scope of patent protection of the embodiments of the present disclosure shall still be subject to the scope defined by the appended claims.

The invention claimed is:

1. A display substrate, comprising a base substrate, and a first conductive layer, a deformation layer, a second conductive layer, and a nanoparticle layer stacked on the base substrate;
   the first conductive layer comprises a plurality of first electrodes, the second conductive layer comprises a plurality of second electrodes, and the nanoparticle layer comprises a plurality of nanoparticles; the display substrate comprises a plurality of sub-pixels defined by intersection of the plurality of first electrodes and the plurality of second electrodes;
   a plurality of first overlapping regions exist between an orthographic projection of the plurality of first electrodes on the base substrate and an orthographic projection of the plurality of second electrodes on the base substrate, and a second overlapping region exists between any one of the first overlapping regions and an orthographic projection of at least one of the nanoparticles on the base substrate; and
   an orthographic projection of each sub-pixel on the base substrate at least partially overlaps with at least two adjacent second overlapping regions.

2. The display substrate of claim 1, wherein the orthographic projection of each sub-pixel on the base substrate at least partially overlaps with two adjacent second overlapping regions; or, the orthographic projection of each sub-pixel on the base substrate at least partially overlaps with three adjacent second overlapping regions.

3. The display substrate of claim 1, wherein the display substrate comprises a plurality of pixel units, wherein each pixel unit comprises the plurality of sub-pixels, and in a same pixel unit, an arrangement direction of the plurality of sub-pixels is different from an arrangement direction of the at least two adjacent second overlapping regions in each sub-pixel.

4. The display substrate of claim 1, further comprising a black matrix layer disposed between the second conductive layer and the nanoparticle layer, or disposed at a side of the nanoparticle layer away from the second conductive layer; and
   the black matrix layer comprises a plurality of black matrix structures disposed between two adjacent sub-pixels.

5. The display substrate of claim 1, wherein in a plane where the display substrate is located, each first electrode has a strip-shaped structure extending along a direction at a first included angle with respect to a first direction, and the second electrode has a strip-shaped structure extending along a direction at a second included angle with respect to the first direction, wherein values of the first included angle and the second included angle range from 0° to 180°.

6. The display substrate of claim 1, wherein the first electrodes and the second electrodes both have arc shapes, a bending direction of an arc shape of a first electrode is opposite to a bending direction of an arc shape of a second electrode, and the plurality of sub-pixels are arranged along the arc shape.

7. The display substrate of claim 1, wherein the first electrodes and the second electrodes both have a light-transmitting structure.

8. The display substrate of claim 1, wherein the first electrodes have a light-reflecting structure, and the second electrodes have a light-transmitting structure.

9. The display substrate of claim 1, further comprising a reflective layer disposed at a side of the base substrate away from the first conductive layer.

10. The display substrate of claim 1, further comprising a reflective layer and an insulating layer, wherein the reflective layer is disposed between the base substrate and the insulating layer, and the insulating layer is disposed between the reflective layer and the first conductive layer.

11. The display substrate of claim 1, wherein the nanoparticles are silver nanoparticles.

12. The display substrate of claim 1, wherein a material quality of the deformation layer is polyacrylate or silicone rubber.

13. The display substrate of claim 1, wherein the nanoparticles are arranged periodically, and a distance between center positions of two adjacent nanoparticles is 200 nm to 400 nm.

14. The display substrate of claim 1, wherein a distance between a side of the nanoparticles facing the second conductive layer and a side of the first conductive layer facing the deformation layer is 2 nm to 20 nm.

15. A display apparatus, comprising the display substrate of claim 1.

16. A method for driving a display substrate, which drives the display substrate of claim 1, comprising: applying different voltages to a plurality of first electrodes and a plurality of second electrodes to cause a deformation layer between the first electrodes and the second electrodes to generate different degrees of deformation.

17. A method for preparing a display substrate, comprising:
forming a first conductive layer at a side of a base substrate, the first conductive layer comprising a plurality of first electrodes arranged in parallel;
forming a deformation layer at a side of the first conductive layer away from the base substrate;
forming a second conductive layer at a side of the deformation layer away from the first conductive layer, the second conductive layer comprising a plurality of second electrodes arranged in parallel; and
forming a nanoparticle layer at a side of the second conductive layer away from the deformation layer, the nanoparticle layer comprising a plurality of nanoparticles;
wherein the display substrate comprises a plurality of sub-pixels defined by intersection of the first electrodes and the second electrodes; a plurality of first overlapping regions exist between an orthographic projection of the plurality of first electrodes on the base substrate and an orthographic projection of the plurality of second electrodes on the base substrate, a second overlapping region exists between any one of the first overlapping regions and an orthographic projection of at least one of the nanoparticles on the base substrate; and an orthographic projection of each sub-pixel on the base substrate at least partially overlaps with at least two adjacent second overlapping regions.

18. The method for preparing the display substrate of claim 17, wherein the first electrodes are formed on the base substrate using an electron beam evaporation process.

19. The method for preparing the display substrate of claim 17, wherein the deformation layer is formed at the side of the first conductive layer away from the base substrate using a nano self-assembly process.

20. The method for preparing the display substrate of claim 17, wherein the nanoparticle layer is formed at the side of the second conductive layer away from the deformation layer using a point spin coating process.

\* \* \* \* \*